(12) United States Patent
Hou et al.

(10) Patent No.: US 10,529,679 B2
(45) Date of Patent: *Jan. 7, 2020

(54) 3D PACKAGES AND METHODS FOR FORMING THE SAME

(71) Applicant: Taiwan Semiconductor Manufacturing Company, Ltd., Hsin-Chu (TW)

(72) Inventors: Shang-Yun Hou, Jubei (TW); Sao-Ling Chiu, Hsin-Chu (TW); Ping-Kang Huang, Chiayi (TW); Wen Hsin Wei, Hsin-Chu (TW); Wen-Chih Chiou, Zhunan Township (TW); Shin-Puu Jeng, Hsin-Chu (TW); Bruce C. S. Chou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 561 days.

This patent is subject to a terminal disclaimer.

(21) Appl. No.: 14/724,694

(22) Filed: May 28, 2015

(65) Prior Publication Data

US 2015/0262958 A1 Sep. 17, 2015

Related U.S. Application Data

(63) Continuation of application No. 14/315,042, filed on Jun. 25, 2014, now Pat. No. 9,048,231, which is a
(Continued)

(51) Int. Cl.
*H01L 23/498* (2006.01)
*H01L 23/00* (2006.01)
(Continued)

(52) U.S. Cl.
CPC ............ *H01L 24/17* (2013.01); *H01L 21/304* (2013.01); *H01L 21/30604* (2013.01);
(Continued)

(58) Field of Classification Search
CPC . H01L 21/44; H01L 23/522; H01L 23/49811; H01L 24/17; H01L 24/03;
(Continued)

(56) References Cited

U.S. PATENT DOCUMENTS 6,225,569 B1 * 5/2001 Hashimoto ....... H01L 23/49811
174/255
6,418,615 B1 7/2002 Rokugawa et al.
(Continued)

*Primary Examiner* — Michael M Trinh
(74) *Attorney, Agent, or Firm* — Slater Matsil, LLP

(57) ABSTRACT

Embodiments of the present disclosure include a semiconductor device and methods of forming a semiconductor device. An embodiment is a method of forming a semiconductor device, the method comprising forming a conductive pad in a first substrate, forming an interconnecting structure over the conductive pad and the first substrate, the interconnecting structure comprising a plurality of metal layers disposed in a plurality of dielectric layers, bonding a die to a first side of the interconnecting structure, and etching the first substrate from a second side of the interconnecting structure, the etching exposing a portion of the conductive pad.

20 Claims, 17 Drawing Sheets

Related U.S. Application Data continuation of application No. 13/938,939, filed on Jul. 10, 2013, now Pat. No. 8,802,504.

(60) Provisional application No. 61/786,031, filed on Mar. 14, 2013.

(51) Int. Cl.

| | | |
|---|---|---|
| *H01L 25/00* | (2006.01) | |
| *H01L 21/44* | (2006.01) | |
| *H01L 23/522* | (2006.01) | |
| *H01L 21/304* | (2006.01) | |
| *H01L 21/306* | (2006.01) | |
| *H01L 21/56* | (2006.01) | |
| *H01L 23/31* | (2006.01) | |

(52) U.S. Cl.
CPC .......... *H01L 21/44* (2013.01); *H01L 21/565* (2013.01); *H01L 23/3107* (2013.01); *H01L 23/49811* (2013.01); *H01L 23/522* (2013.01); *H01L 23/5226* (2013.01); *H01L 24/03* (2013.01); *H01L 24/09* (2013.01); *H01L 24/11* (2013.01); *H01L 24/81* (2013.01); *H01L 25/50* (2013.01); *H01L 2224/0382* (2013.01); *H01L 2224/0401* (2013.01); *H01L 2224/05026* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/1182* (2013.01); *H01L 2224/13* (2013.01); *H01L 2224/16113* (2013.01); *H01L 2224/16227* (2013.01); *H01L 2224/73204* (2013.01); *H01L 2224/81815* (2013.01); *H01L 2224/97* (2013.01); *H01L 2924/0002* (2013.01); *H01L 2924/181* (2013.01)

(58) Field of Classification Search
CPC ......... H01L 24/09; H01L 24/11; H01L 24/81; H01L 21/304; H01L 21/30604; H01L 21/565; H01L 23/3107; H01L 25/50; H01L 2224/29021; H01L 2224/05026; H01L 2224/03001; H01L 2224/03002; H01L 2224/27001; H01L 2224/27002; H01L 2224/82001; H01L 2224/82005; H01L 23/5226; H01L 23/49822; H01L 24/05; H01L 24/16; H01L 2224/73204; H01L 2224/03602; H01L 2224/03616; H01L 2224/81005; H01L 2224/81001
USPC ........ 438/107, 108, 109, 110, 118, 125, 126
See application file for complete search history.

(56) References Cited

U.S. PATENT DOCUMENTS

| | | | |
|---|---|---|---|
| 6,781,224 B2 * | 8/2004 | Yoneda | H01L 21/4846 257/686 |
| 6,905,914 B1 | 6/2005 | Huemoeller et al. | |
| 6,995,455 B2 * | 2/2006 | Nemoto | H01L 23/3107 257/621 |
| 7,093,356 B2 | 8/2006 | Imafuji et al. | |
| 7,185,429 B2 | 3/2007 | Kusano et al. | |
| 7,285,856 B2 | 10/2007 | Ooi et al. | |
| 7,397,000 B2 | 7/2008 | Shimoto et al. | |
| 7,435,680 B2 | 10/2008 | Nakamura et al. | |
| 7,696,613 B2 | 4/2010 | Nakamura et al. | |
| 7,800,227 B2 * | 9/2010 | Kamiyama | H01L 23/4824 257/758 |
| 7,902,660 B1 | 3/2011 | Lee et al. | |
| 8,021,918 B2 * | 9/2011 | Lin | H01L 21/76816 257/678 |
| 8,130,509 B2 * | 3/2012 | Tsai | H01L 24/05 257/529 |
| 8,334,461 B2 | 12/2012 | Taguchi et al. | |
| 8,530,751 B2 | 9/2013 | Maeda et al. | |
| 8,609,998 B2 | 12/2013 | Miyasaka et al. | |
| 8,802,504 B1 * | 8/2014 | Hou | H01L 23/49811 438/108 |
| 9,048,231 B2 * | 6/2015 | Hou | H01L 23/49811 |
| 9,210,808 B2 * | 12/2015 | Kaneko | H05K 1/113 |
| 2004/0004293 A1 | 1/2004 | Murayama | |
| 2005/0046524 A1 * | 3/2005 | Sasaki | H01P 3/081 333/238 |
| 2005/0088833 A1 | 4/2005 | Kikuchi et al. | |
| 2005/0121768 A1 * | 6/2005 | Edelstein | H01L 21/486 257/698 |
| 2006/0121719 A1 * | 6/2006 | Nakamura | H01L 21/4857 438/613 |
| 2007/0045780 A1 | 3/2007 | Akram et al. | |
| 2008/0188037 A1 * | 8/2008 | Lin | H01L 21/4846 438/108 |
| 2008/0298038 A1 * | 12/2008 | Kaneko | H01L 23/49811 361/808 |
| 2009/0052150 A1 | 2/2009 | Kobayashi | |
| 2009/0170242 A1 * | 7/2009 | Lin | H01L 21/6835 438/107 |
| 2009/0315190 A1 * | 12/2009 | Kikuchi | H01L 21/4857 257/778 |
| 2010/0176494 A1 * | 7/2010 | Chen | H01L 21/76898 257/621 |
| 2010/0263923 A1 * | 10/2010 | Kodani | H01L 21/4853 174/260 |
| 2011/0000706 A1 | 1/2011 | Shomura et al. | |
| 2011/0024898 A1 | 2/2011 | Leung et al. | |
| 2011/0201151 A1 | 8/2011 | Gambino et al. | |
| 2013/0062761 A1 * | 3/2013 | Lin | H01L 23/49816 257/738 |
| 2014/0225258 A1 | 8/2014 | Chiu et al. | |

* cited by examiner

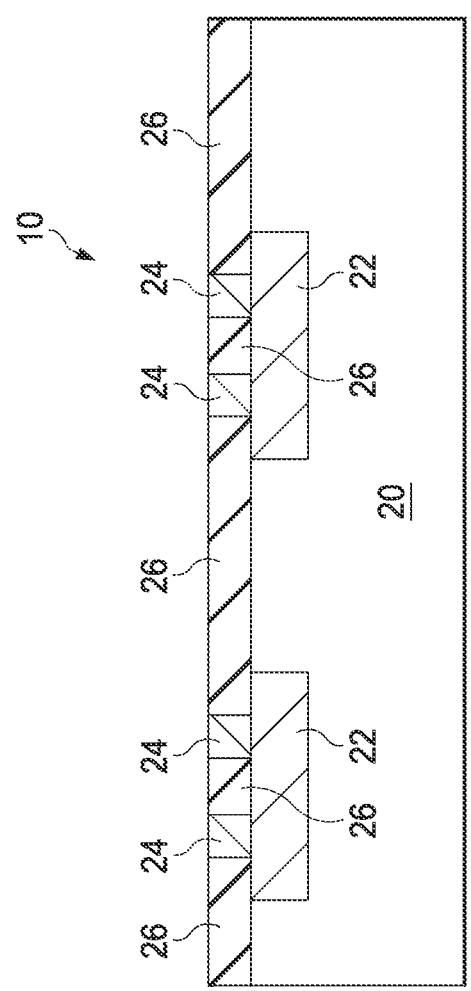

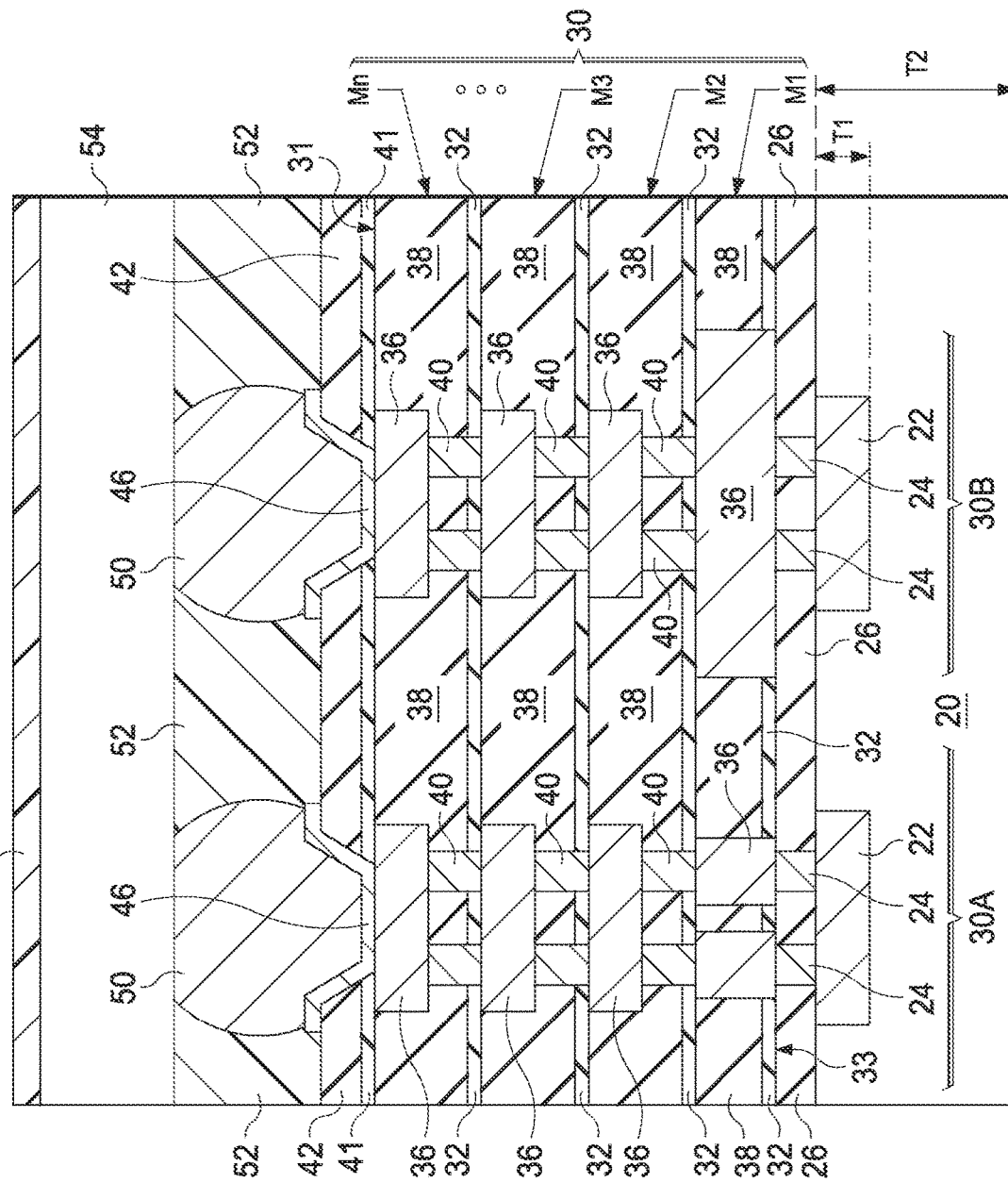

3D PACKAGES AND METHODS FOR FORMING THE SAME

This application is a continuation and claims the benefit of U.S. patent application Ser. No. 14/315,042, filed on Jun. 25, 2014, now U.S. Pat. No. 9,048,231, and entitled "3D Packages and Methods for Forming the Same," which is a continuation and claims the benefit of U.S. patent application Ser. No. 13/938,939, filed on Jul. 10, 2013, now U.S. Pat. No. 8,802,504, and entitled "3D Packages and Methods for Forming the Same," which claims the benefit of U.S. Provisional Application No. 61/786,031, filed on Mar. 14, 2013, and entitled "3D Packages and Methods for Forming the Same," which applications are hereby incorporated by reference.

CROSS REFERENCE TO RELATED APPLICATION

The present application is related to co-pending U.S. patent application Ser. No. 13/763,335, filed on Feb. 8, 2013, entitled "3D Packages and Methods for Forming the Same," and commonly assigned to the assignee of the present application, which application is hereby incorporated by reference herein.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. In addition, when more devices are put into one chip or die, more complex designs are required.

In an attempt to further increase circuit density, three-dimensional (3D) ICs have been investigated. In a typical formation process of a 3D IC, two or more dies or chips are bonded together and electrical connections are formed between each die or chip and contact pads on a substrate.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 2A through 2G illustrate intermediate stages of forming a semiconductor device according to an embodiment;

DETAILED DESCRIPTION OF ILLUSTRATIVE EMBODIMENTS

Figures 1, 6:
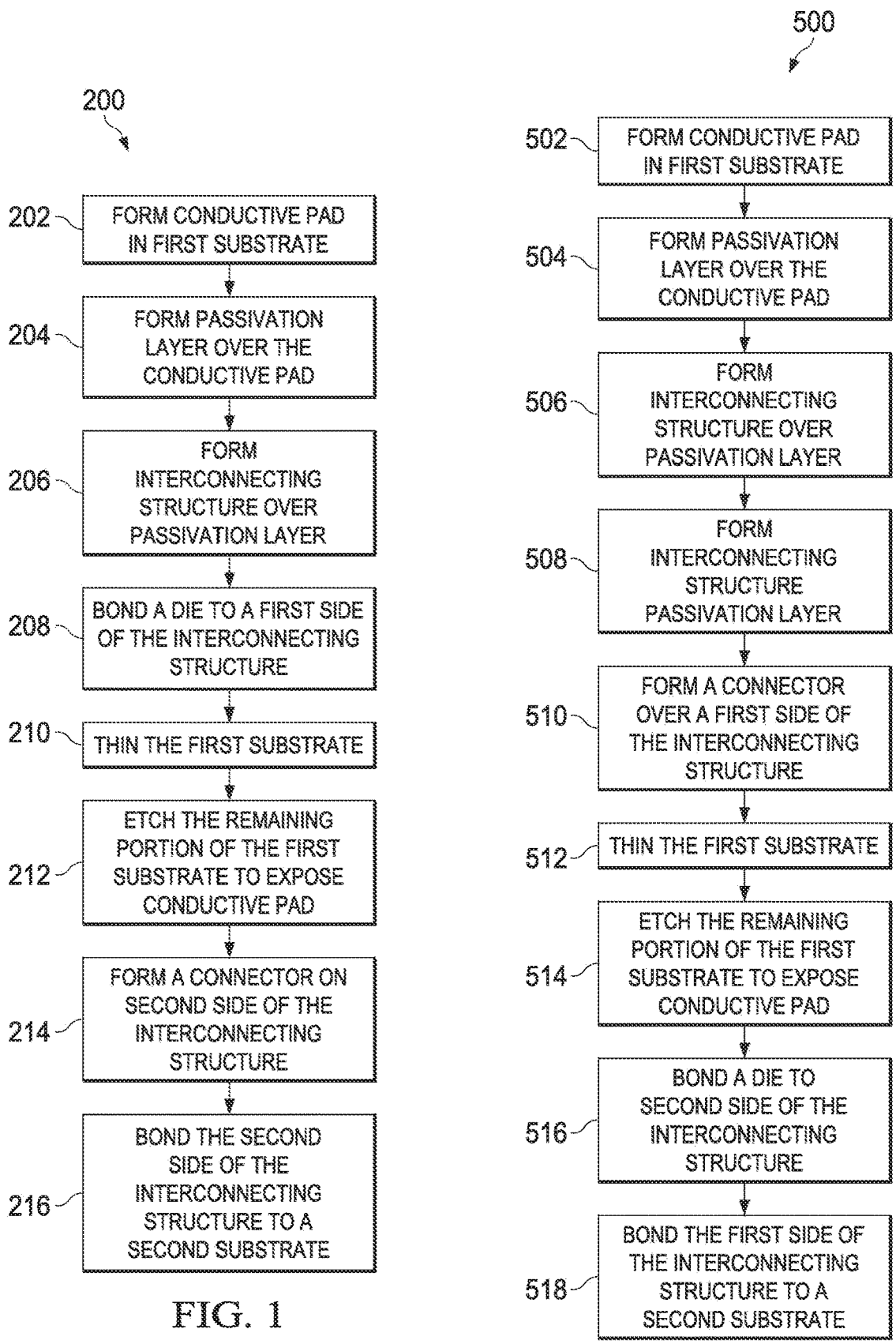
FIG. 1 illustrates a flow diagram of a method for manufacturing a semiconductor device according to an embodiment.
FIG. 6 illustrates a flow diagram of a method for manufacturing a semiconductor device according to an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a semiconductor device with an interconnecting structure without a substrate and without through substrate vias. Other embodiments may also be applied, however, to other interconnecting structures.

In a formation process of a 3D IC, two or more dies or chips are bonded together and electrical connections are formed between each die or chip and contact pads on a substrate. For example, interposer stacking is part of 3D IC technology, where a through substrate via (TSV) embedded interposer is connected to a device chip or die with a micro bump. Interposer stacking manufacturing process flows can be separated into at least two types. In a first type, a chip-on-chip-on-substrate (CoCoS) process flow, a silicon interposer chip is first mounted onto a packaging substrate, and then a different device silicon chip is bonded onto the interposer. In a second type, a chip-on-wafer-on-substrate (CoWoS) process flow, a device silicon chip is first bonded onto a silicon interposer wafer, which is then diced. The resulting stacked silicon is then mounted onto a substrate.

FIG. 1 illustrates a flow diagram of a method 200 for manufacturing a semiconductor device in accordance with an embodiment. While method 200 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2B:
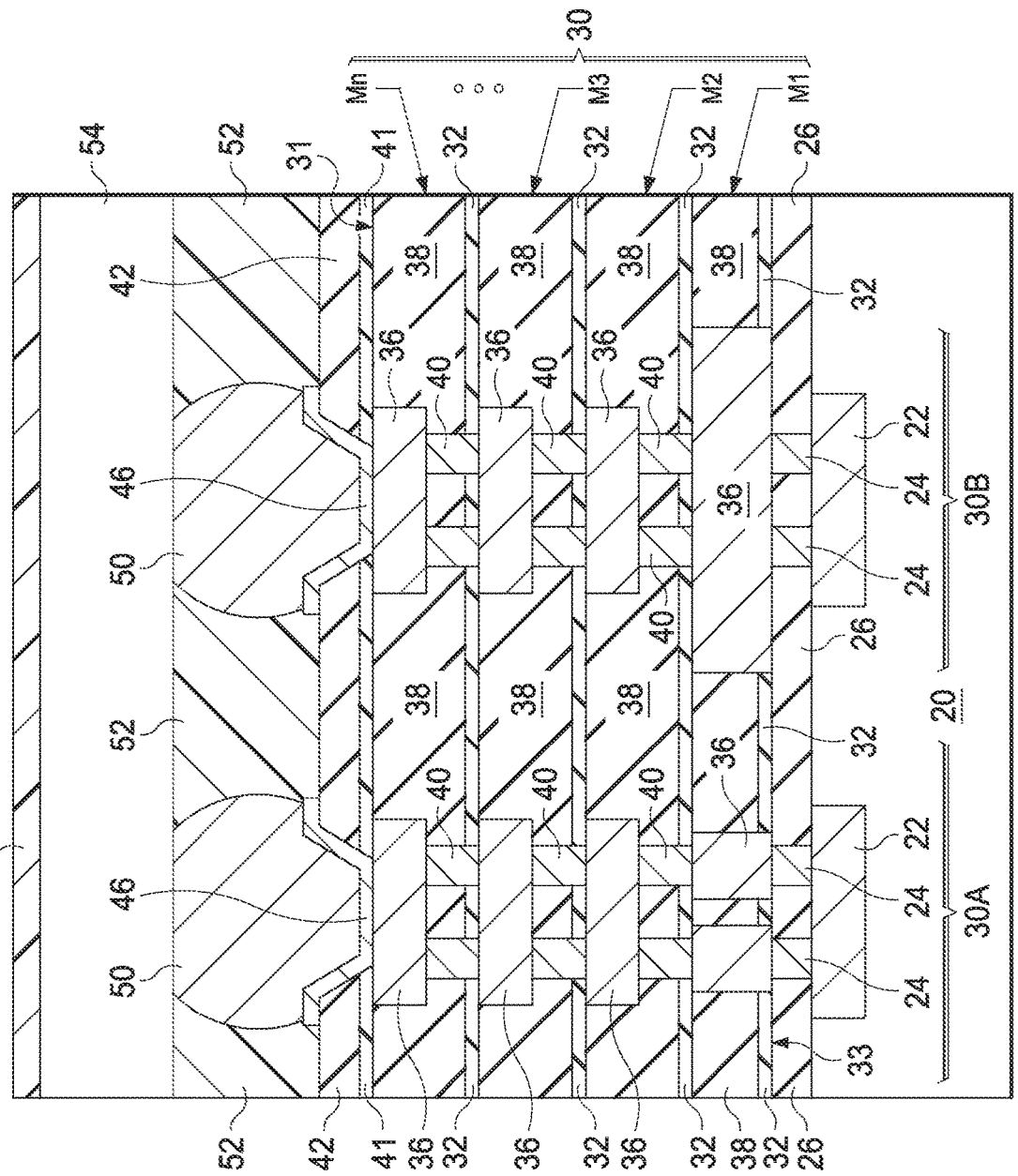

The operations of method 200 will be described with reference to FIGS. 2A through 2G as an example, although the method 200 may be applied to other embodiments. At operation 202, a conductive pad is formed in a first substrate. Operation 202 is illustrated in FIG. 2A as illustrated below.

Referring to FIG. 2A, a semiconductor device 10 at an intermediate stage of processing is illustrated. The semiconductor device 10 includes a conductive pads 22 in a top surface of a first substrate 20, a passivation layer 26 formed on the first substrate 20 and the conductive pads 22, and pad connectors 24 formed through the passivation layer 26 and in contact with the conductive pads 22.

The first substrate 20 may be formed of a semiconductor material, such as silicon, silicon germanium, silicon carbide, gallium arsenide, or other commonly used semiconductor materials. Alternatively, the first substrate 20 is formed of a dielectric material, such as glass, aluminum oxide, aluminum nitride, the like, or a combination thereof. The first substrate 20 is free from active devices (such as transistors and diodes) and passive devices (such as inductors, resistors, and capacitors).

The conductive pads 22 may be formed in a top surface of the first substrate 20. The conductive pads may be formed by forming recesses (not shown) into the first substrate 20. The recesses may be formed into the first substrate 20 to allow the conductive pads 22 to be embedded into the substrate 20. These embedded conductive pads 22 may act as underbump metallizations after the first substrate 20 is removed through subsequent processing. (see FIG. 2E). The recesses may be formed using a suitable photolithographic mask and etching process, although any suitable process to form recesses allowing the embedding of the conductive pads 22 may be used.

After the recesses are formed in the first substrate 20, the recesses may be filled with a conductive material to form the conductive pads 22. In some embodiments, a barrier layer (not shown) may be formed in the recesses to help to block diffusion of the subsequently formed conductive pads 22 into the adjacent substrate 20. The barrier layer (not shown) may comprise titanium, titanium nitride, tantalum, tantalum nitride, manganese, manganese oxide, cobalt, cobalt oxide, cobalt nitride, the like, or a combination thereof and 28 may be formed by chemical vapor deposition (CVD), physical vapor deposition (PVD), plasma enhanced CVD (PECVD), atomic layer deposition (ALD), the like, or a combination thereof to a thickness from about 5 Å to about 200 Å.

The conductive material may be formed by an electrochemical plating process, sputtering, CVD, ALD, PVD, the like, or a combination thereof. In an embodiment, the conductive material of the conductive pads 22 may comprise copper, tungsten, aluminum, silver, gold, the like, or a combination thereof. After the conductive material is formed in the recesses (not shown), the conductive material may be planarized by a planarization process, such as a chemical mechanical polishing (CMP) process. In an embodiment, the conductive pads 22 have a thickness in a range from about 5.0 kÅ to about 30.0 kÅ. In some embodiments, the top surfaces of the conductive pads 22 may be substantially coplanar with a top surface of the substrate 20.

At operation 204, a passivation layer is formed on the conductive pad and the first substrate. Operation 204 is illustrated in FIG. 2A as described below.

The passivation layer 26 is formed on the conductive pads 22 and the first substrate 20. The passivation layer 26 can be silicon nitride, silicon carbide, silicon oxide, low-k dielectrics such as carbon doped oxides, extremely low-k dielectrics such as porous carbon doped silicon dioxide, a polymer, such as an epoxy, polyimide, benzocyclobutene (BCB), polybenzoxazole (PBO), the like, or a combination thereof, although other relatively soft, often organic, dielectric materials can also be used, and deposited by chemical vapor deposition (CVD), physical vapor deposition (PVD), atomic layer deposition (ALD), a spin-on-dielectric process, the like, or a combination thereof. In some embodiments, the passivation layer 26 is a polymer such as polyimide.

After the passivation layer 26 is formed, pad connectors 24 may be formed through the passivation layer 26 and in contact with the conductive pads 22. The pad connectors allow for electrical and physical coupling between conductive pads 22 and subsequently formed interconnecting structure 30. The pad connectors 24 may be formed by forming openings (not shown) to expose portions of the conductive pads 22. The openings may be formed into the passivation layer 26 to allow the pad connectors 24 to be embedded into the passivation layer 26. The openings may be formed using a suitable photolithographic mask and etching process, although any suitable process to form openings allowing the embedding of the pad connectors 24 may be used.

After the openings (not shown) are formed, a conductive material may be formed in the openings to form the pad connectors 24. The forming of the of the pad connectors 24 may include a barrier layer and a conductive material similar to conductive pads 22, although the pad connectors 24 and the conductive pads 22 materials need not be the same.

At operation 206, an interconnecting structure is formed over the passivation layer and the conductive pads. Operation 206 is illustrated in FIGS. 2B and 2C as described below.

Figure 2C:
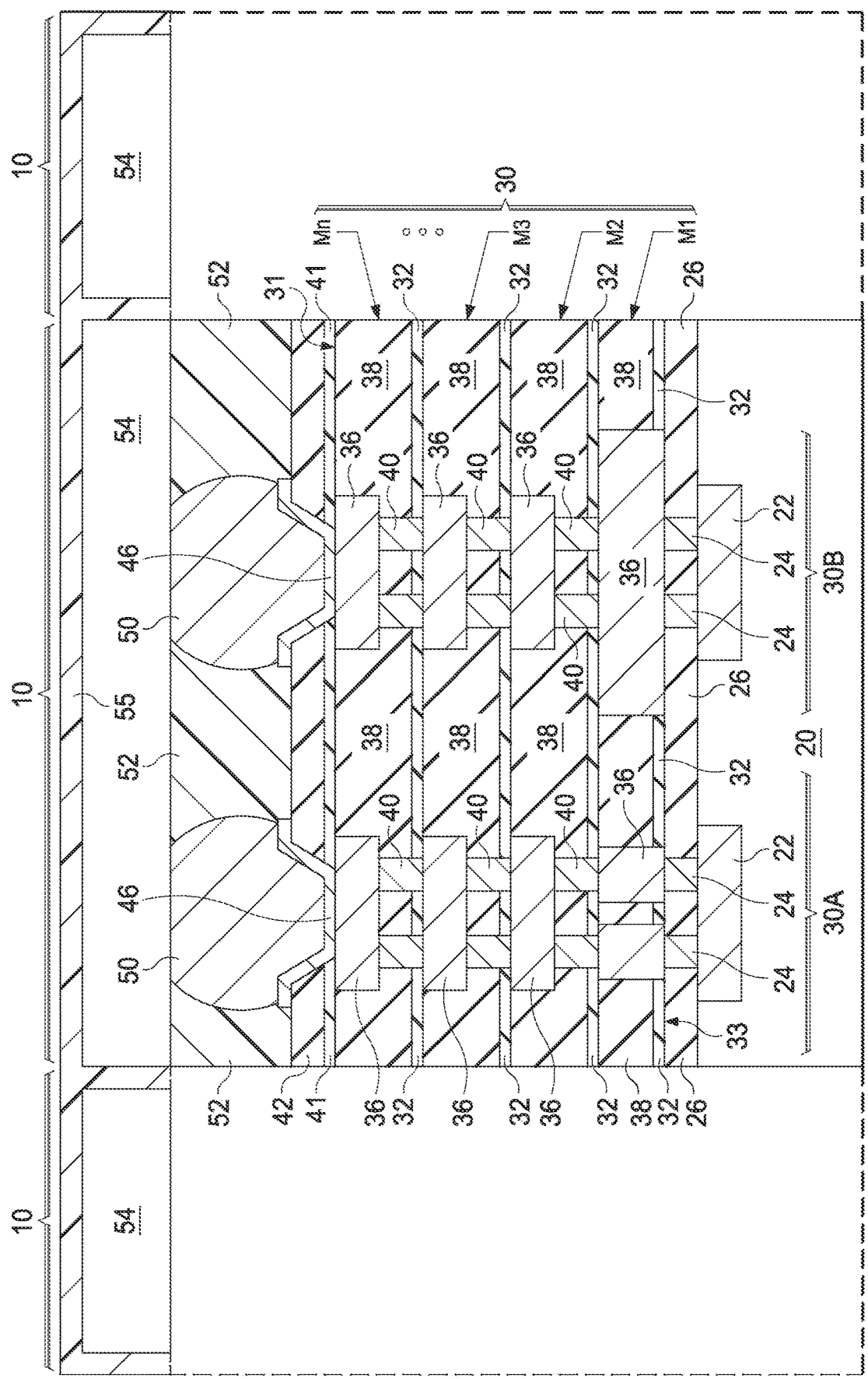

Referring to FIG. 2B, an interconnecting structure 30 is formed on the passivation layer 26 and the pad connectors 24, a die 54 is bonded to a first side 31 of the interconnecting structure 30 with connectors 50 on under bump metallizations (UBMs) 46, and a molding compound 55 is surrounding the die 54 (see also FIG. 2C).

The interconnecting structure 30 comprises a plurality of thin film layers with a plurality of metal layers disposed therein. The plurality of thin film layers include inter-metal dielectrics (IMDs) 38 and etch stop layers 32. The plurality of metal layers includes metal lines 36 and vias 40. The metal lines 36 and vias 40 may electrically connect the die 54 on a first side 31 of the interconnecting structure 30 with the conductive pads 22 on a second side 33 which may be connected to various devices and/or substrates to form functional circuitry (see FIG. 2I). The IMDs 38 may be formed of oxides such as silicon oxide, borophosphosilicate glass (BPSG), undoped silicate glass (USG), fluorinated silicate glass (FSG), low-k dielectric materials, the like, or a combination thereof. Different respective IMDs may comprise different materials. The low-k dielectric materials may have k values lower than 3.9. In some embodiments, the low-k dielectric materials have a k value less than 3.0 or even less than 2.5. In some other embodiments, the low-k dielectric materials have a k value less than 2.0. The etch stop layers 32 can be silicon nitride, silicon carbide, silicon oxide, low-k dielectrics such as carbon doped oxides, extremely low-k dielectrics such as porous carbon doped silicon dioxide, the like, or a combination thereof, and deposited by CVD, PVD, ALD, a spin-on-dielectric process, the like, or a combination thereof. Conductive materials, such as copper, aluminum, titanium, the like, or a combination thereof, with or without a barrier layer, can be used as the metal lines 36 and the vias 40. In an embodiment, each of the metal layers M1 through Mn has a thickness in a range from about 5.0 kÅ to about 30.0 kÅ.

Interconnecting structure 30 includes a plurality of metal layers, namely M1, M2, M3, and Mn, wherein metal layer M1 is the metal layer directly connected to the pad connectors 24, while metal layers M2 and M3 are intermediate layers above metal layer M1, and metal layer Mn is the metal layer that is immediately under the overlying UBMs 46, wherein the value n of Mn is greater than or equal to two. The metal layer Mn may be referred to as a metal pad or a contact pad. Throughout the description, the term "metal layer" refers to the collection of the metal lines in the same layer, and the term "metal layer" does not include a through substrate via (TSV). Metal layers M1 through Mn are formed in the IMDs 38. In an embodiment, the metal lines 36 are formed to have a width from about 0.8 um to about 30 um with a spacing between adjacent metal lines 36 from about 0.8 um to about 30. In some embodiments the metal lines 36 are formed to have a width from about 0.4 um to about 5 um with a spacing between adjacent metal lines from about 0.4 um to about 5 um.

As illustrated in FIG. 2B, the interconnecting structure 30 may comprise a first portion 30A and a second portion 30B. The first portion 30A has a non-continuous metal line 36 of the metal layer M1, and the second portion 30B has metal pad in the metal line 36 of metal layer M1 that may be larger than the metal lines 36 in the other layers. In other embodiments, other layers M2 through Mn may have metal lines 36 that are larger metal lines 36 in metal layer M1. In some embodiments, both the first and second portions 30A and 30B may comprise metal pads in the metal lines 36 of metal layer M1 and each may have connectors formed the metal pads (see FIGS. 7A through 6D).

In an embodiment, the metal line 36 of metal layer M1 has a surface substantially coplanar with the second side 33 of the interconnecting structure 30, and the metal line 36 of the metal layer Mn has a surface substantially coplanar with the first side 31 of the interconnecting structure 30. There may be ten vias 40 or up to N vias 40 connecting the adjacent metal lines 36 rather than the two vias 40 illustrated in FIG. 2B. The large number of vias 40 in each metal layer may be used to lower the resistance between the connectors 50 and the connectors 68 (see FIG. 2H), to improve heat dissipation in the interconnecting structure 30, and/or for structural support in the interconnecting structure 30.

The metal layers, M1, M2, M3, and Mn may be formed using a single and/or a dual damascene process, a via-first process, or a metal-first process. Damascene means formation of a patterned layer embedded in another layer such that the top surfaces of the two layers are coplanar. A damascene process which creates either only trenches or vias is known as a single damascene process. A damascene process which creates both trenches and vias at once is known as a dual damascene process.

In an exemplary embodiment, the metal layers M1 through Mn are formed using a dual damascene process. In this example, the formation of the M1 layer may begin with the formation of an etch stop layer 32 on the passivation layer 26 and the pad connectors 24 with an IMD 38 on the etch stop layer 32. Once the IMD 38 is deposited, portions of the IMD 38 may be etched away to form recessed features, such as trenches and vias, which can be filled with conductive material to connect different regions of the interconnecting structure 30 and accommodate the metal lines 36 and vias 40. This process may be repeated for the remaining metal layers M2 through Mn.

The number of metal layers M1 to Mn, the number of IMDs 38, the number of vias 40, and the number of metal lines 36 are only for illustrative purposes and are not limiting. There could be other number of layers that is more or less than the four metal layers illustrated. There may be other number of IMD layers, other number of vias, and other number of metal lines different from those illustrated in FIG. 2B.

In some embodiments, the vias 40 of the adjacent metal layers are not aligned (offset) from the vias 40 of a metal layer Mn and the vias 40 of different layers may be a different size than vias 40. In some embodiments, all the metal layers, M1 through Mn, are substantially vertically aligned. In some embodiments, a top surface area of the metal lines 36 in each of the metal layers may be substantially equal to each of the other metal layers of the interconnecting structure 30. In other embodiments, the metal layers M1 through Mn are not aligned and have different top surface areas. The vias 40 and the metal lines may be any suitable shape such as, a square, a circle, a rectangle, a hexagon, other polygons, or the like.

At operation 208, a die is bonded to a first side of the interconnecting structure. Operation 208 is illustrated in FIG. 2B as described below.

Referring back to FIG. 2B, after the formation of the interconnecting structure 30, a first passivation layer 41 and a second passivation layer 42 may be formed to cover and protect the metal lines 36 and the interconnecting structure 30. The first and second passivation layers 41 and 42 may be similar to the passivation layer 26 discussed above and will not be repeated herein, although the passivation layer 26 and the first and second passivation layers 41 and 42 need not be the same.

After the formation of the second passivation layer 42, openings may be formed through the second passivation layer 42 and the first passivation layer 41 to expose portions of the metal lines 36 of metal layer Mn. The openings allow for electrical and physical coupling between metal lines 36 of metal layer Mn of the interconnecting structure 30 and the subsequently formed UBMs 46. These openings may be formed using a suitable photolithographic mask and etching process, although any suitable process to expose portions of the metal lines 36 of metal layer Mn may be used.

After the openings are formed through the first and second passivation layers 41 and 42, the UBMs 46 may be formed along the second passivation layer 42 and in the openings over the metal lines 36 of metal layer Mn. In an embodiment the UBMs 46 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 46. Any suitable materials or layers of material that may be used for the UBMs 46 are fully intended to be included within the scope of the current application.

The UBMs 46 may be created by forming each layer over the second passivation layer 42 and along the interior of the openings through the first and second passivation layers 41 and 42 to the metal lines 36 of the metal layer Mn. The forming of each layer may be performed using a plating process, such as electrochemical plating, although other processes of formation, such as sputtering, evaporation, or plasma-enhanced CVD (PECVD) process, may alternatively be used depending upon the desired materials. Once the desired layers have been formed, portions of the layers may then be removed through a suitable photolithographic masking and etching process to remove the undesired material and to leave the UBMs 46 in a desired shape, such as a circular, octagonal, square, or rectangular shape, although any desired shape may alternatively be formed.

After the UBMs 46 are formed, an active surface of the die 54, the active surface comprising the connectors 50, is bonded to a first side 31 of the interconnecting structure 30 by way of the connectors 50 and the UBMs 46. The die 54 may be a device die comprising integrated circuit devices, such as transistors, capacitors, inductors, resistors (not shown), and the like, therein. Further, the die 54 may be a logic die comprising core circuits, and may be, for example, a central processing unit (CPU) die. In some embodiments, the die 54 may comprise multiple stacked dies like a memory stacking. The connectors 50 may be bonded to contacts or bond pads (not shown) on the die 54.

The connectors 50 are illustrated as micro bumps in FIG. 2B, however in other embodiments, the connectors 50 may be solder balls, metal pillars, controlled collapse chip connection (C4) bumps, electroless nickel-electroless palladium-immersion gold technique (ENEPIG) formed bumps, or the like. The connectors 50 may comprise a conductive material such as copper, aluminum, gold, nickel, silver, palladium, tin, the like, or a combination thereof. In an embodiment in which the connectors 50 are tin solder bumps, the connectors 50 may be formed by initially forming a layer of tin through such commonly used methods such as evaporation, electroplating, printing, solder transfer, ball placement, or the like. Once a layer of tin has been formed on the structure, a reflow may be performed in order to shape the material into the desired bump shape. In another embodiment the connectors 50 may be metal pillars (such as copper pillars), which may be pre-formed before the die 54 is placed over the interconnecting structure 30. The metal pillars may be formed by a plating process and may be solder free and comprise substantially vertical sidewalls. In this embodiment, the UBMs 46 may be omitted as the metal pillars may extend from the metal lines 36 to the die 54.

The bonding between the die 54 and the interconnecting structure 30 may be a solder bonding or a direct metal-to-metal (such as a copper-to-copper or tin-to-tin) bonding. In an embodiment, the die 54 may be bonded to the interconnecting structure 30 by a reflow process. During this reflow process, the connectors 50 are in contact with the UBMs 46 to physically and electrically couple the die 54 to the interconnecting structure 30.

An underfill material 52 may be injected or otherwise formed in the space between the die 54 and the interconnecting structure 30. The underfill material 52 may, for example, comprise a liquid epoxy, deformable gel, silicon rubber, or the like, that is dispensed between the die 54 and the interconnecting structure 30, and then cured to harden. This underfill material 52 is used, among other things, to reduce cracking in and to protect the connectors 50.

A molding compound 55 may be formed surrounding the die 54 (see FIG. 2C) and on the underfill 52 and over a first side 31 of the interconnecting structure 30. The molding compound may provide protection and rigidness to the die 54 and the semiconductor device 10. In an embodiment, the molding compound 55 may be a nonconductive material, such as an epoxy, a resin, polyimide, polybenzoxazole (PBO), benzocyclobutene (BCB), a silicone, an acrylate, the like, or a combination thereof. The molding compound 55 may be formed to have a top surface over, substantially level with, or a backside surface of the die 54.

As illustrated in FIG. 2C, in some embodiments, there may be a plurality of semiconductor devices 10 formed adjacent each other on the first substrate 20. The molding compound 55 surrounds the dies 54 and is on the underfill 52 and portions of the interconnecting structures 30.

At operation 210, the first substrate 20 is thinned. Operation 210 is illustrated in FIG. 2D as described below.

FIG. 2D illustrates the thinning of the backside surface of the first substrate 20. The thinning process may be performed using an etching process, a chemical mechanical polishing (CMP) process, and/or a planarization process, such as a grinding process. After the substrate 20 is thinned, the substrate may have a thickness T2 which is less than the thickness T1 of the conductive pad 22 plus about 5 um. For example, if the conductive pad thickness T1 is 1 um, the thickness T2 of the remaining first substrate 20 less than 6 um.

At operation 212, the remaining portion of the first substrate is removed. Operation 212 is illustrated in FIG. 2E as described below.

Figure 2E:
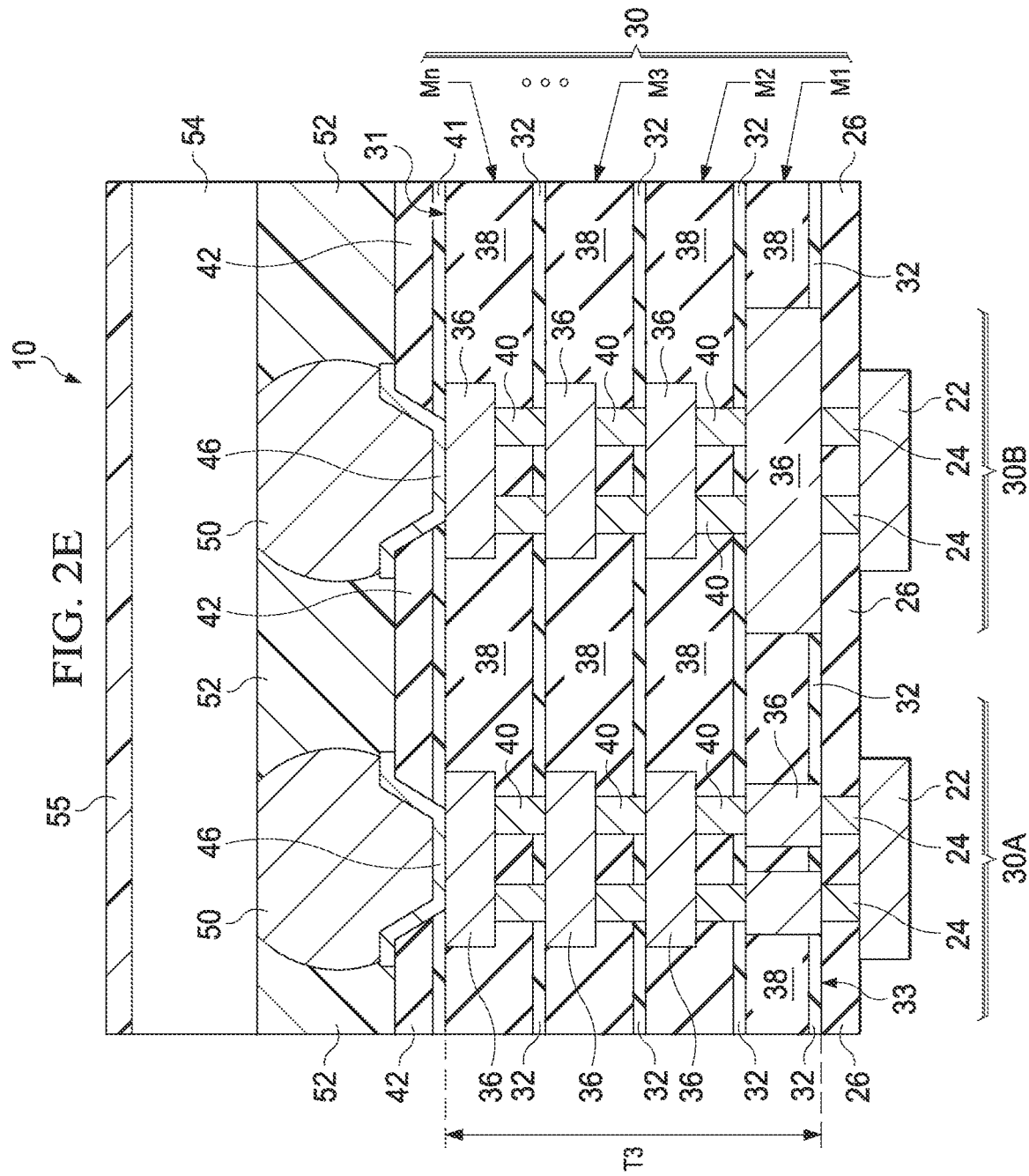

FIG. 2E illustrates the removal of the remaining portion of the first substrate 20. The remaining portion of the first substrate 20 may be removed by a wet etch process that is selective to the first substrate 20 without attacking the conductive pads 22. In an embodiment, the selective wet etch comprises an etchant comprising tetramethylammonium hydroxide (TMAH) as it enables selective crystallographic etching of silicon. In another embodiment, the selective wet etch comprises HF and $HNO_3$. In some embodiments, the wet etch process includes a corrosion inhibitor comprising benzotriazole (BTA), tolytriazole (TTA), triphenylmethane, the like, or a combination thereof. The selective wet etch removes the remaining portion of the first substrate 20 to expose the conductive pads 22 and the passivation layer 26. In an embodiment, the interconnecting structure 30 has a thickness T3 in a range from about 3 µm to about 10 µm. In another embodiment, the interconnecting structure 30 may have a thickness T3 in a range from about 3 µm to about 30 µm.

The exposed conductive pads 22 may be used as UBMs for subsequently formed connectors (see FIGS. 2H, 3B, and 4) and may be referred to as UBMs 22. In some embodiments, the exposed conductive pads 22 may be used as a conductive pillar and mounted to another device and/or substrate without forming a connector on the conductive pad 22.

With the removal of the first substrate 20, the interconnecting structure 30 may provide an interface and structure to couple the die 54 on its first side 31 to one or more devices and/or substrates on its second side 33 via the UBMs 22. In some embodiments, the interconnecting structure 30 is free from a substrate and is also free from through substrate vias (TSVs). This provides for an interconnecting structure 30 that may be thinner than a structure with a substrate and also an interconnecting structure 30 that costs less to manufacture than a structure with TSVs. Further, the interconnecting structure 30 is more flexible and can bend (warp) and may accommodate the stresses and forces of subsequent processing (e.g. bonding the die 54 to the interconnecting structure 30) better than a structure with a substrate.

At operation 214 a connector is formed over the second side of the interconnecting structure. Operation 214 is illustrated in FIG. 2F as described below.

Figure 2F:
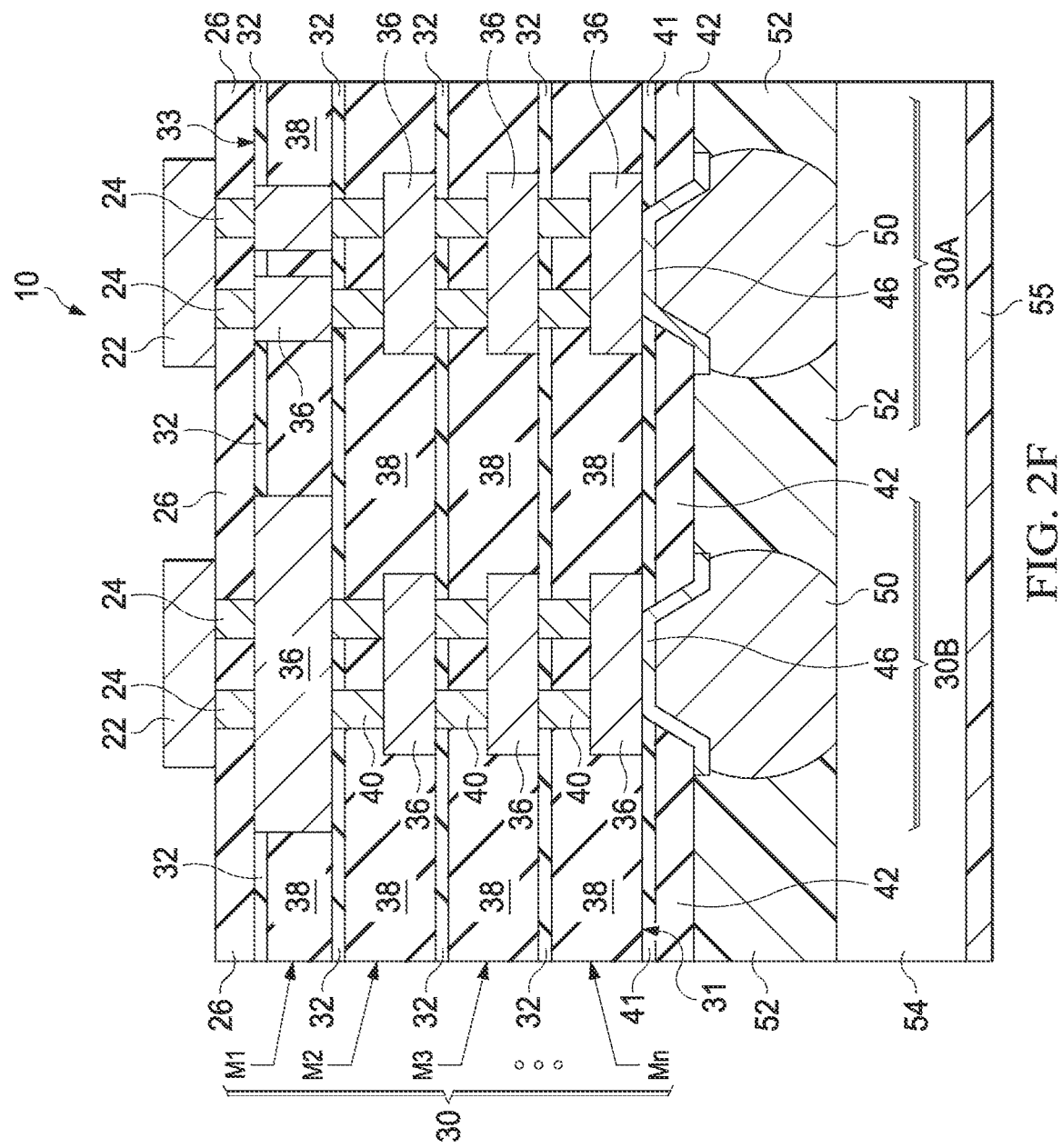

In FIG. 2F, the semiconductor device 10 has been flipped over so that the die 54 and molding compound 55 are towards the bottom of the figure. The exposed conductive pads 22 may be used as the connector and directly mounted to another device and/or substrate without forming another connector on the conductive pad 22. (see FIG. 2G).

At operation 216, a second side of the interconnecting structure may be bonded to a second substrate. Operation 216 is illustrated in FIG. 2G as described below.

Figure 2G:
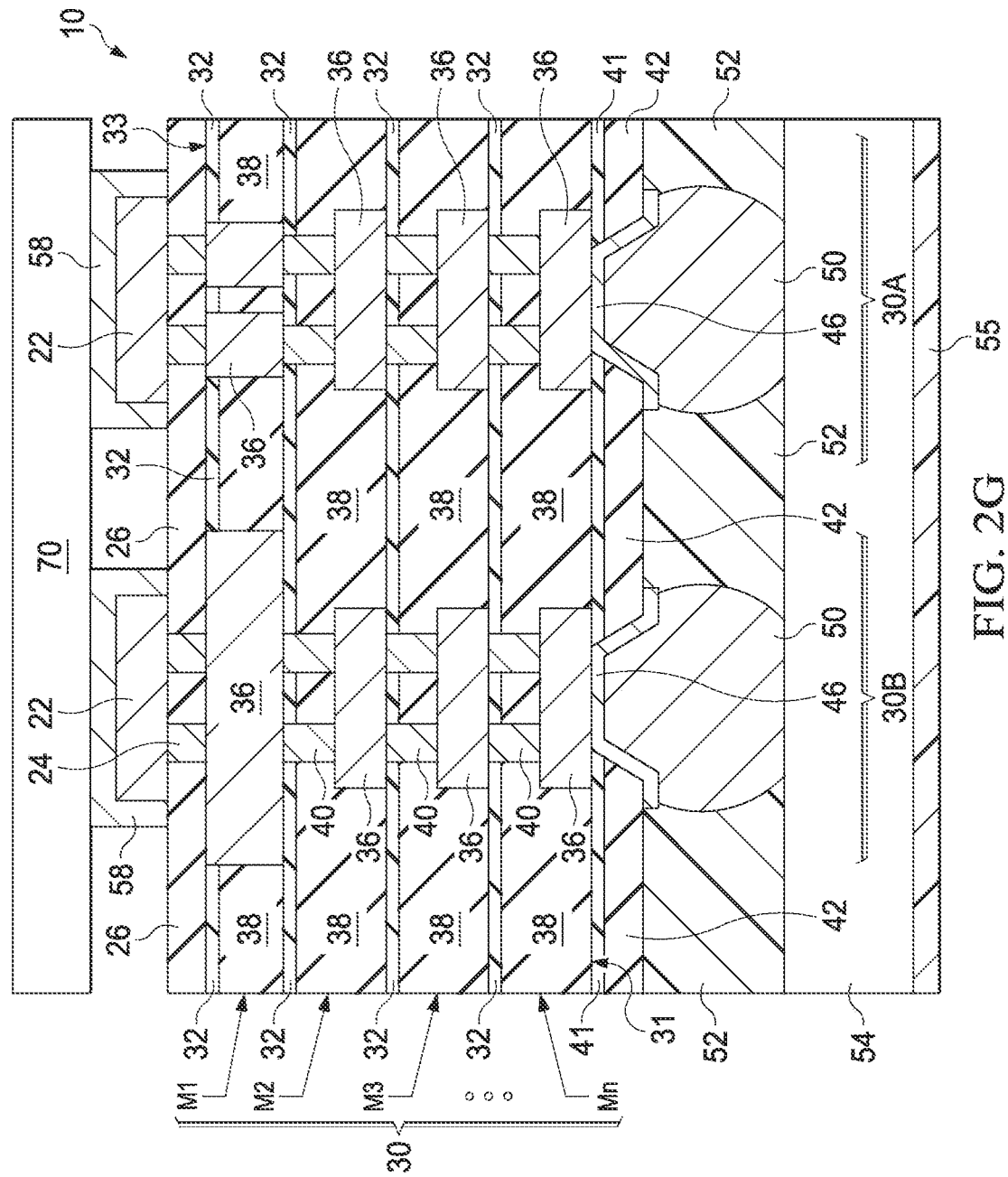

FIG. 2G illustrates bonding the second side 33 of the interconnecting structure 30 to a second substrate 70 by way the conductive pads 22. The second substrate 70 may be similar to the first substrate 20 as described above, although the first substrate 20 and the second substrate 70 need not be the same. Second substrate 70 is, in one alternative embodiment, based on an insulating core such as a fiberglass reinforced resin core. One example core material is fiberglass resin such as FR4. Alternatives for the core material include bismaleimide-triazine (BT) resin, or alternatively, other PC board materials or films. Build up films such as Ajinomoto build-up film (ABF) or other laminates may be used for second substrate 70.

The second substrate 70 has contacts 58 which will be physically and electrically coupled to the conductive pads 22. In some embodiments, the contacts 58 may comprise a pre-solder layer, and in other embodiments, the contacts 58 may comprise a bond pad, or solder ball. The contacts 58 may comprise solder, tin, silver, tin, the like, or a combination thereof. In an embodiment, the second substrate 70 may be bonded to the interconnecting structure 30 by a reflow process. During this reflow process, the contacts 58 on the second substrate 70 are in contact with the conductive pads 22 to physically and electrically couple the second substrate 70 to the interconnecting structure 30.

The number of conductive pads 22, the number of contacts 72, and the number of UBMs 46 in FIG. 2G are only for illustrative purposes and are not limiting. There could be any suitable number of conductive pads 22, UBMs 46, and contacts 58.

Figure 3A:
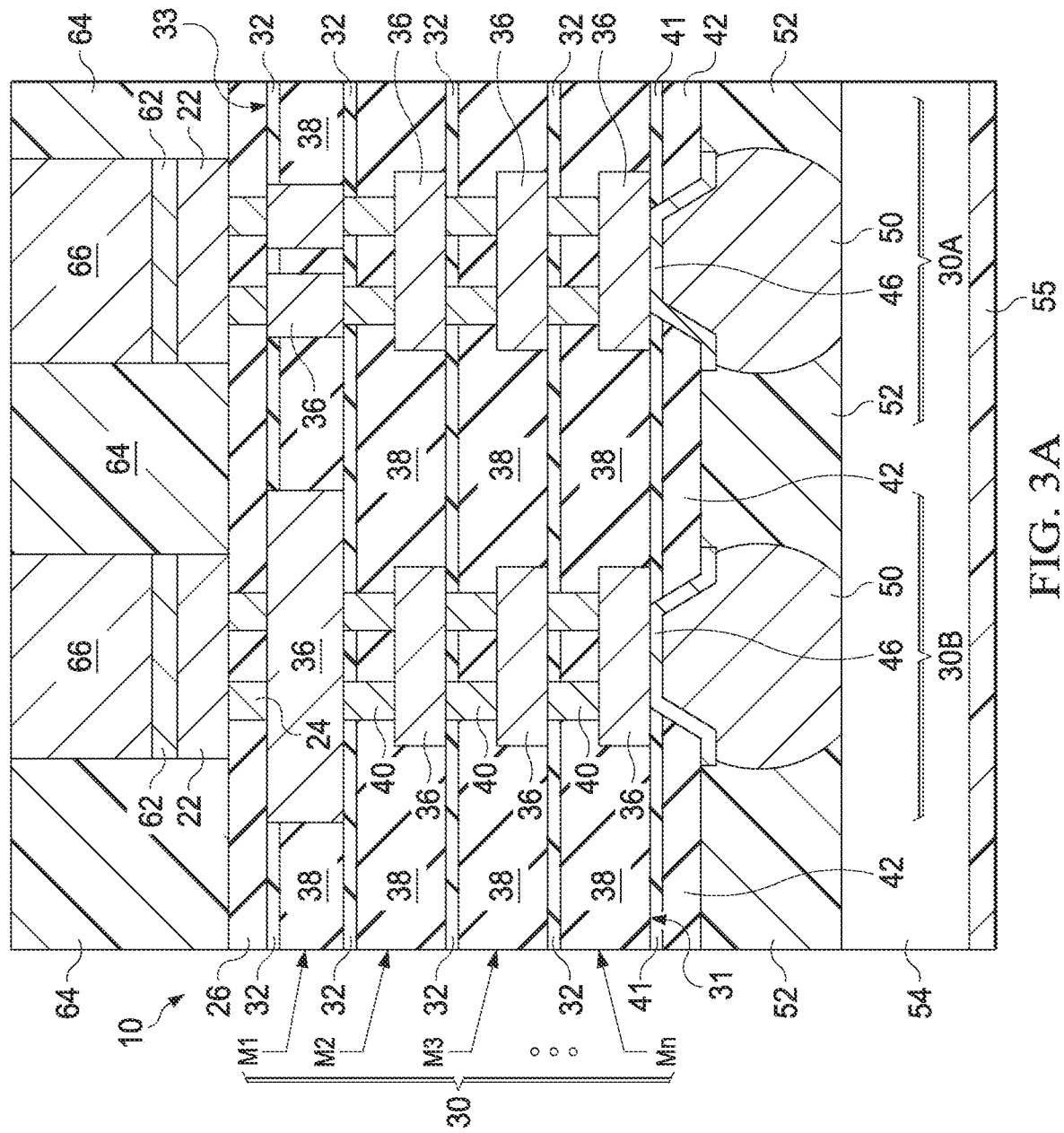
FIGS. 3A through 3C illustrate intermediate stages of forming a semiconductor device according to an embodiment.
Figure 3B:
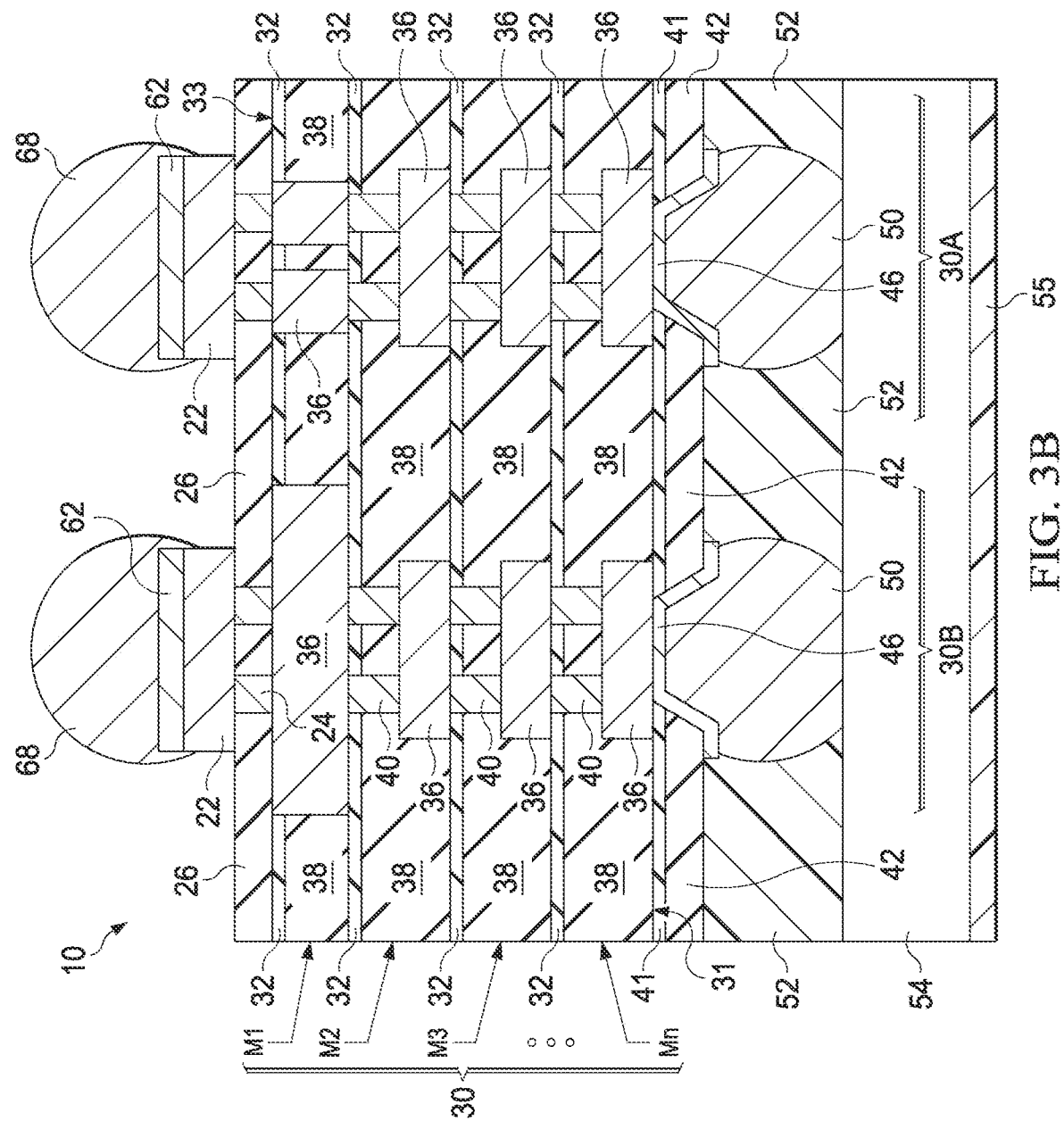
Figure 3C:
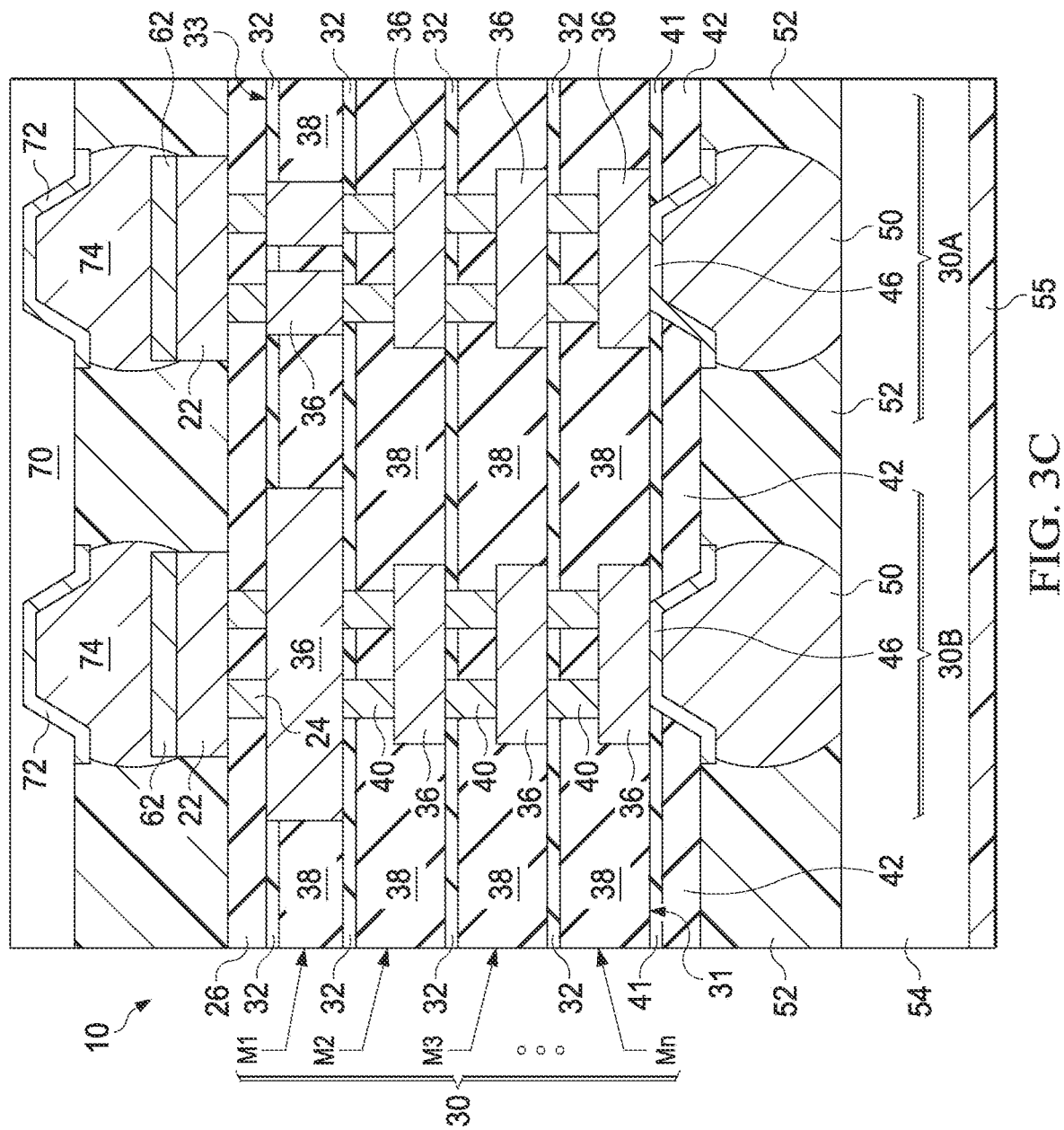

FIGS. 3A through 3C illustrate plating a connector on the conductive pads 22 and bonding to a second substrate according to another embodiment. FIG. 3A illustrates the formation of a patterned photoresist 64 on the passivation layer 26 and exposing the UBMs 22, a seed layer 62 on the UBMs 22, and a conductive material 66 on the seed layer 62. The photoresist 64 may then be formed to UBMs 22, and the photoresist may then be patterned to expose of the portions of the UBMs 22 where the conductive material 66 is desired to be located. In some embodiments, one or more barrier layers (not shown) may be formed on the UBM 22 comprising titanium, titanium nitride, tantalum, tantalum nitride, the like, or a combination thereof. The one or more barrier layers may be formed by CVD, PVD, PECVD, ALD, the like, or a combination thereof. The seed layer 62 may comprise a titanium copper alloy or the like on the one or more barrier layers, if present, through CVD, sputtering, the like, or a combination thereof. Once the seed layer 62 been formed and patterned, the conductive material 66, such as copper, aluminum, gold, nickel, silver, tin, the like, or a combination thereof may be formed on the seed layer through a deposition process such as plating, CVD, PVD, the like, or a combination thereof. In another embodiment, the seed layer 62 may be formed before the photoresist 64 and patterned after the photoresist 64 is removed using conductive material 66 as a mask.

FIG. 3B illustrates the removal of the photoresist 64 and the formation of the connector 68 from the conductive material 66. The photoresist 64 may be removed through a suitable removal process such as ashing. The conductive material 66 may be shaped to form connectors 68 with a rounded top surface by performing a reflow process on the conductive material 66. In some embodiments, the connectors 68 may be substantially aligned with one of the UBMs 46 and connectors 50 in the first portion 30A and/or the second portion 30B of the interconnecting structure 30 as illustrated in FIG. 3B.

In some embodiments, there may be a plurality of semiconductor devices 10 formed adjacent each other on the first substrate 20 (see FIG. 2C). In these embodiments, after the formation of the connector 68, semiconductor devices 10 may be sawed apart, so that the semiconductor devices 10 are separated from each other. In some embodiments, in order to saw the semiconductor devices 10, the plurality of semiconductor devices are attached on a dicing tape (not shown), and are diced when attached to the dicing tape.

FIG. 3C illustrates bonding the second side 33 of the interconnecting structure 30 to a second substrate 70 by way of bonding structures 74 and the UBMs 22. The second substrate 70 and the contacts 72 may be similar to the second substrate 70 and the contacts 58 described above with reference to FIG. 2G and the descriptions will not be repeated herein. In an embodiment, the second substrate 70 may be bonded to the interconnecting structure 30 by a reflow process. During this reflow process, the contacts 72 on the second substrate 70 are in contact with the connectors 68 to form bonding structures 74 to physically and electrically couple the second substrate 70 to the interconnecting structure 30 via the UBMs 22.

The number of bonding structures 74, the number of contacts 72, the number of UBMs 46 and 22, and the number of connectors 50 in FIG. 3C are only for illustrative purposes and are not limiting. There could be any suitable number of UBMs 46 and 22, bonding structures 74, connectors 50, and contacts 72.

Figure 4A:
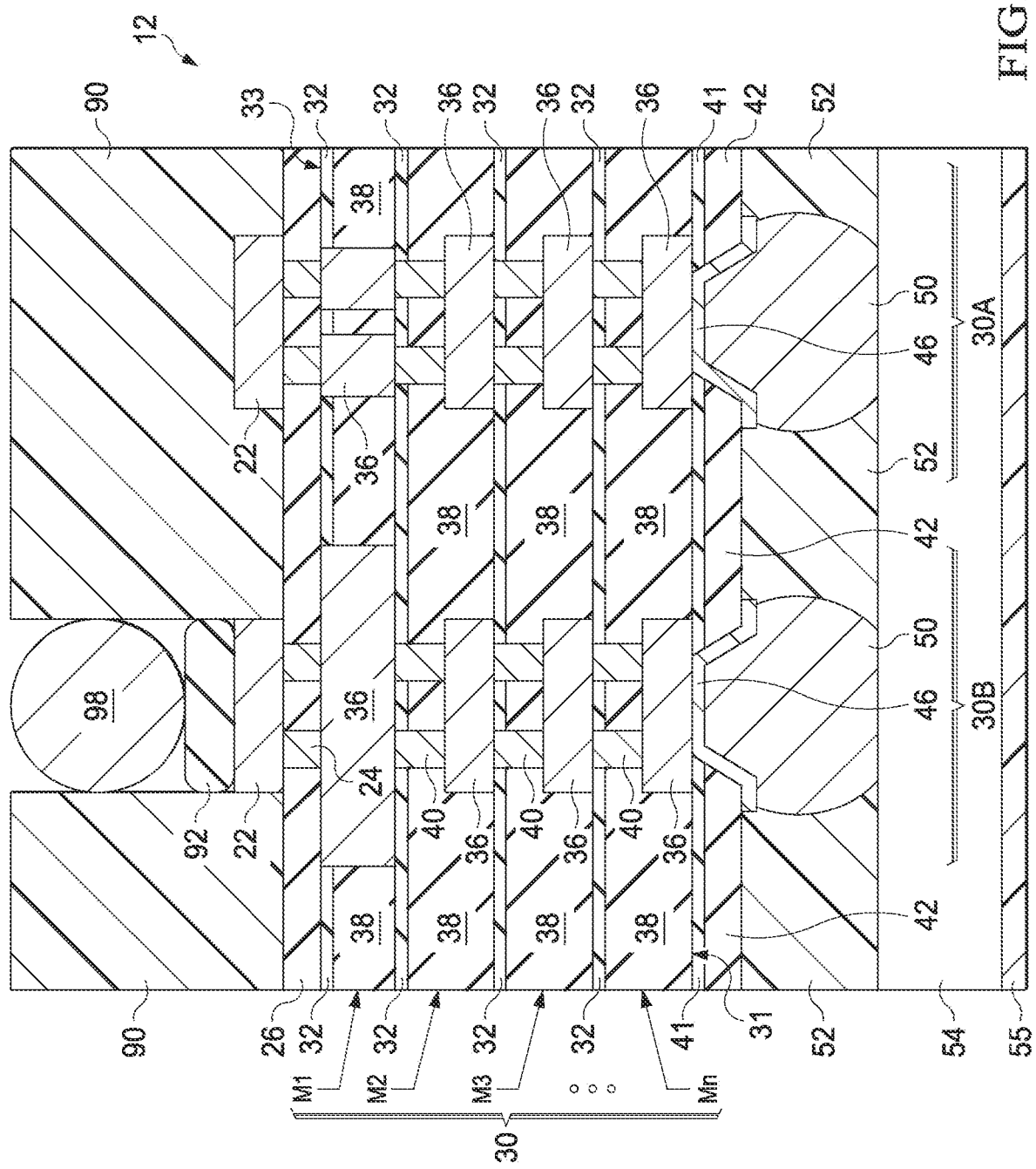
FIG. 4A through 4B illustrate intermediate stages of forming a semiconductor device according to an embodiment.
Figure 4B:
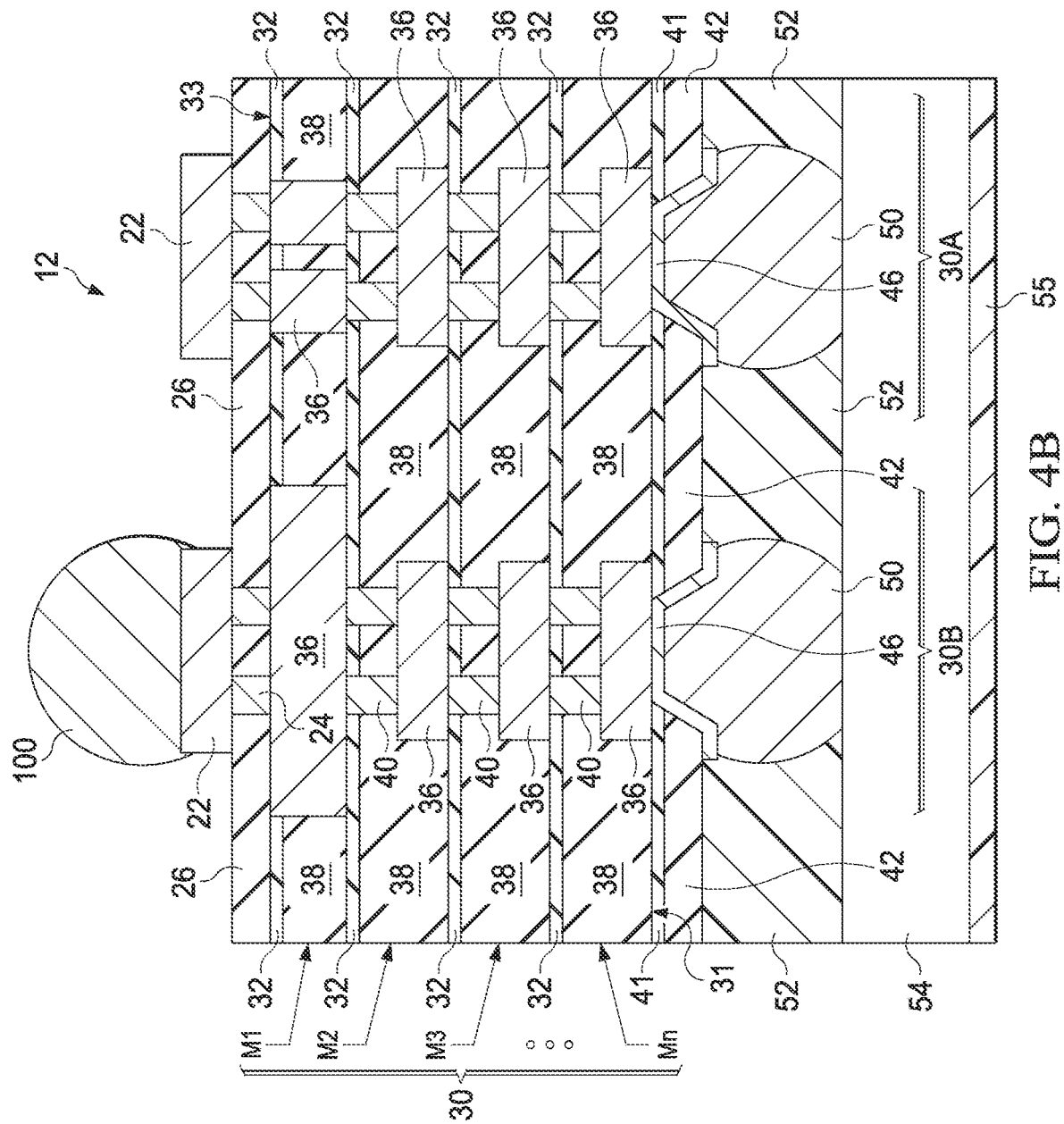

FIGS. 4A and 4B illustrate a semiconductor device 12 according to another embodiment, wherein the connector on the UBM 22 of the interconnecting structure 30 is formed by a solder ball drop method. Details regarding this embodiment that are similar to those for the previously described embodiment will not be repeated herein.

FIG. 4A illustrates a semiconductor device 12 with a photoresist 90 on a passivation layer 26, flux 92 on the UBM 22 (conductive pad 22), and a solder ball 98 on the flux 92. In an embodiment, the flux 92 may be formed on the UBM 22 by dipping the UBM 22 in flux so that flux 92 may be deposited on the UBM 22 in the opening formed in the photoresist 90. In another embodiment, the flux 92 may be deposited as a paste and may be printed on the UBM 22 and in the opening formed in the photoresist 90. After the flux 92 is formed, a solder ball 98 is formed on the flux 92. The solder ball 98 may be formed by a solder ball drop process. The solder ball drop process is known in the art, and thus, is not detailed herein.

FIG. 4B illustrates the formation of the connector 100. The connector 100 may allow various other devices and/or substrates to be electrically coupled to the second side 33 of the interconnecting structure 30 (see FIG. 2I). The photoresist 90 may be removed through a suitable removal process such as ashing. The connector 100 is formed by performing a reflow process on the solder ball 98 and the flux 92. The connector 100 may cost less to form than the connector 68 of FIG. 3B. However, an embodiment with connector 68 may have better electrical migration properties than an embodiment with connector 100 due to intermetallic compounds near an interface with UBM 22 of the connector 100 embodiment. The thermal cycling properties of the connector 100 are similar to the thermal cycling properties of the connector 68. In some embodiments, the first portion 30A of interconnecting structure 30 may also have a connector 100 formed on the UBM 22.

Figure 5:
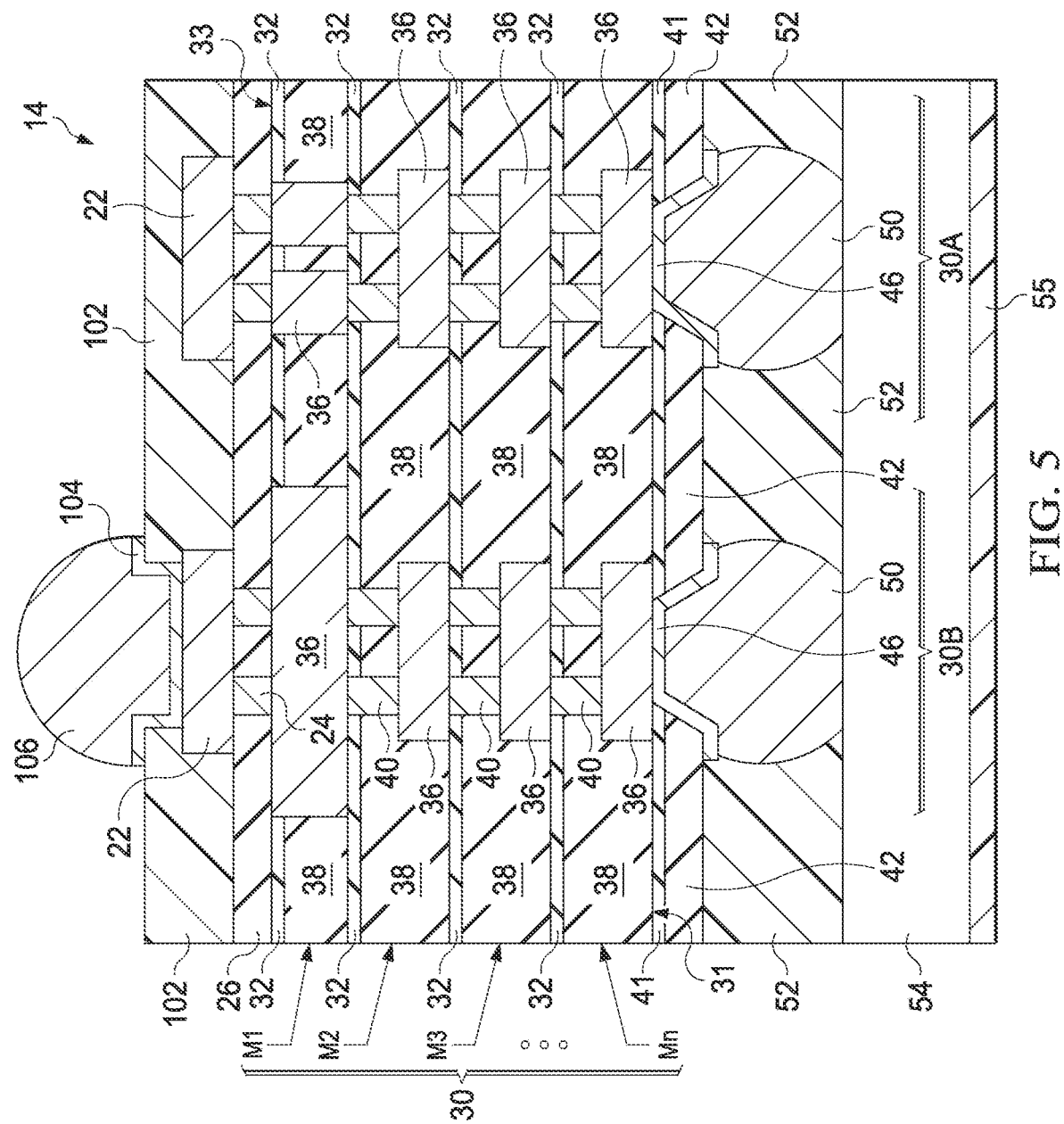
FIG. 5 illustrates a semiconductor device according to an embodiment.

FIG. 5 illustrates a semiconductor device 14 according to another embodiment, wherein the connector on the second side 33 of the interconnecting structure 30 includes a polymer layer on the passivation layer 26. Details regarding this embodiment that are similar to those for the previously described embodiment will not be repeated herein.

FIG. 5 illustrates a semiconductor device with a polymer layer 102 on the passivation layer 26 and on a portion of a top surface of the UBM 22. The polymer layer 102 may be formed of a polymer, such as an epoxy, polyimide, BCB, PBO, the like, or a combination thereof, although other relatively soft, often organic, dielectric materials can also be used. The polymer layer 102 may be formed by spin coating or other commonly used methods. After the polymer layer 102 is formed on the passivation layer 26 and the UBMs 22, an opening may be formed through the polymer layer 102 to expose a portion of at least one UBM 22. A seed layer 104 may be deposited along the polymer layer 102 and in the opening over the UBM 22 and a connector 106 may be formed on the seed layer 104 and in the opening over the UBM 22. The seed layer 104 and the connector 106 may be similar to the seed layer 62 and the connector 68 as described above with reference to FIGS. 3A and 3B and the description of them will not be repeated herein.

FIG. 6 illustrates a flow diagram of a method 500 for manufacturing a semiconductor device in accordance with an embodiment. While method 500 is illustrated and described below as a series of acts or events, it will be appreciated that the illustrated ordering of such acts or events are not to be limited to a particular embodiment. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The operations of method 500 will be described with reference to FIGS. 7A through 7C as an example, although the method 500 may be applied to other embodiments.

At operation 502, a conductive pad is formed in a first substrate. At operation 504, a passivation layer is formed over the conductive pad. At operation 506, an interconnecting structure is formed over the passivation layer and the conductive pad. At operation 504 a connector is formed over a first side of the interconnecting structure 30. Operations 502, 504, 506, 508, and 510 are illustrated in FIG. 7A as described below.

Figure 7A:
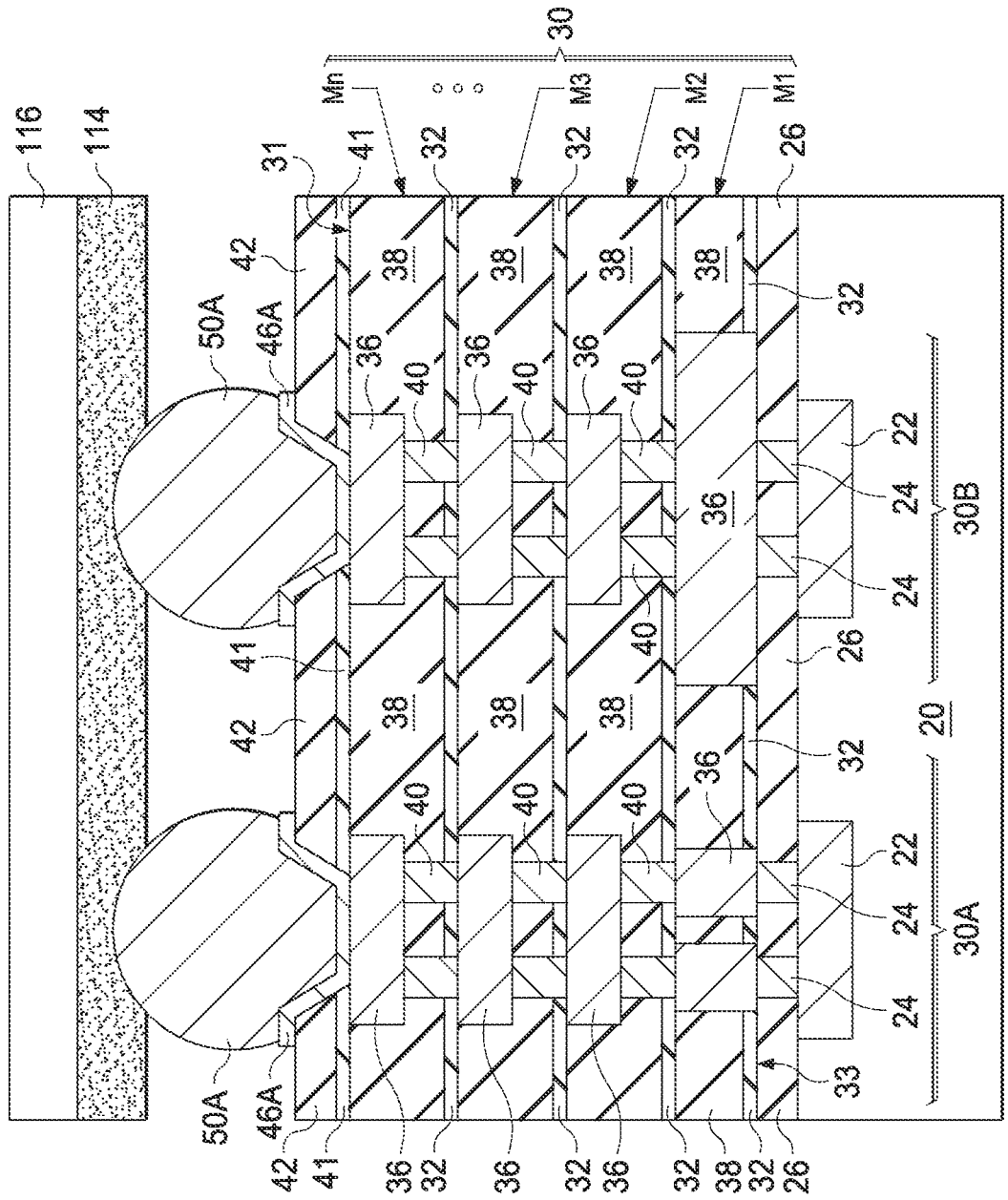
FIGS. 7A through 7C illustrate intermediate stages of forming a semiconductor device according to an embodiment.

FIG. 7A illustrates a semiconductor device 16 at an intermediate stage of processing according to an embodiment. The semiconductor device 16 includes conductive pads 22 formed in a first substrate 20, a passivation layer 26 formed on a first substrate 20 and the conductive pads 22, pad connectors 24 formed in the passivation layer 26 and contacting the conductive pads 22, an interconnecting structure 30 formed on the passivation layer 26 and the pad connectors 24, first and second passivation layers 41 and 42 formed over the interconnecting structure 30, UBMs 47A formed in openings and along the first and second passivation layers 41 and 42, connectors 50A formed over the second passivation layer 42 and in electrical contact with the first side 31 of the interconnecting structure, and a carrier 116 mounted to the connectors 50A with an adhesive layer 114. UBMS 47A may be similar to UBMS 46 and connectors 50A may be similar to connectors 50 described above and the descriptions will not be repeated herein. Details regarding this embodiment that are similar to those for the previously described embodiment will not be repeated herein.

A carrier 116 may then be mounted to the connectors 50A through an adhesive layer 114. The adhesive layer 114 may be disposed, for example laminated, on the carrier 116. The adhesive layer 114 may be formed of a glue, such as an ultra-violet glue, or may be a lamination layer formed of a foil. The carrier 116 may be any suitable substrate that provides (during intermediary operations of the fabrication process) mechanical support for the layers on top. The carrier 116 may comprise a wafer comprising glass, silicon (e.g., a silicon wafer), silicon oxide, metal plate, a ceramic material, or the like.

At operation 512, the first substrate is thinned. Operation 512 is illustrated in FIG. 7B as described below.

Figure 7B:
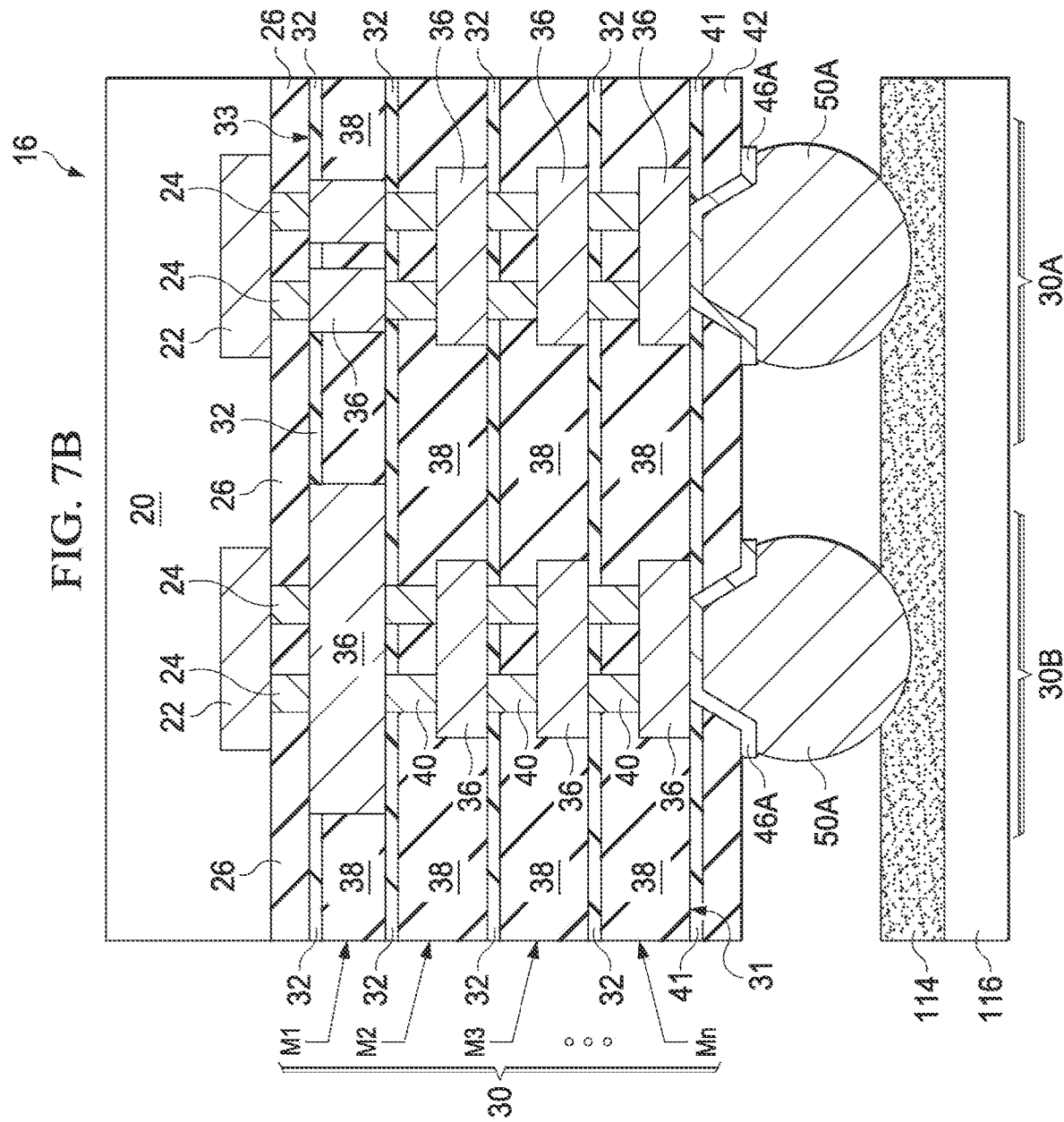

FIG. 7B illustrates the thinning of the first substrate 20. In FIG. 7B, the semiconductor device 16 has been flipped over so that the carrier 116 is towards the bottom of the figure. The thinning process of the first substrate 20 may be similar to the process described above with reference to FIG. 2D and the description of them will not be repeated herein.

At operation 514, the remaining portions of the first substrate 20 may be removed. Operation 514 is illustrated in FIG. 7C.

Figure 7C:
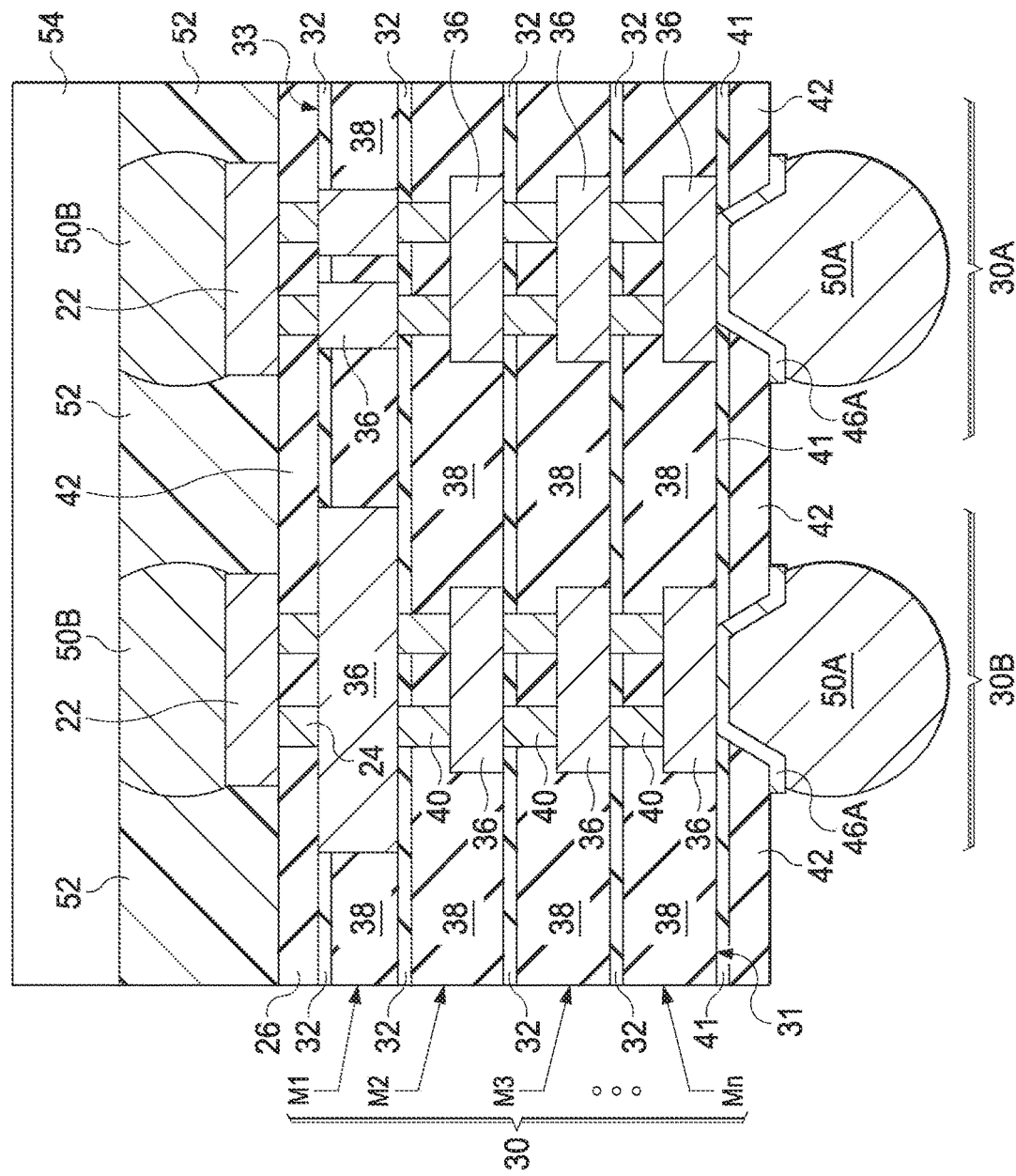

FIG. 7C illustrates the removal of the remaining portion of the first substrate 20 and to expose portions of UBM 22. The removal of the remaining portion of the first substrate 20 may be similar to the process described above with reference to FIG. 2E and the description will not be repeated herein.

At operation 516, a die is bonded to the second side of the interconnecting structure. Operation 516 is illustrated in FIG. 7C as described below.

FIG. 7C illustrates the bonding of the die 54 to the second side 33 of the interconnecting structure 30 by way of connectors 50B and UBMs 22 with an underfill material 52 between the die 54 and the passivation layer 26. The UBMs 22 may be similar to the UBMs 22 described above with reference to FIGS. 2F through 2I and the description will not be repeated herein. The die 54 and the process of bonding the die to the interconnecting structure 30 were described above with reference to FIG. 2A and the description of them will not be repeated herein. The connectors 50B may be similar to connectors 50 described above and the description will not be repeated herein, although connectors 50A and connectors 50B need not be the same.

At operation 518, the first side of the interconnecting structure may be bonded to a second substrate. Operation 518 may be similar to the process described above with reference to FIG. 2I except that this operation bonds the first side 31 of the interconnecting structure 30 to the second substrate rather than the second side 33 of the interconnecting structure 30 as described above. Thus, the description of this operation will not be repeated herein.

By having an interconnecting structure 30 coupling the die 54 to the second substrate 70, the cost of the semiconductor device 10 may be much lower than other devices. Because the interconnecting structure 30 does not have a substrate, through substrate vias (TSVs) are not necessary to couple the die 54 to the second substrate 70, and TSVs are a significant cost in other devices. Further, because the process does not require a carrier wafer or the formation of backside connectors, the cost of the devices may be reduced. However, the yield, reliability, and performance of the interconnecting structure 30 are not impacted by the removal of the substrate and/or the lack of TSVs. Rather, the reliability may be enhanced due to the omission of the TSVs and the formation of backside connectors.

An embodiment is a method of forming a semiconductor device, the method comprising forming a conductive pad in a first substrate, forming an interconnecting structure over the conductive pad and the a first substrate, the interconnecting structure comprising a plurality of metal layers disposed in a plurality of thin film dielectric layers, bonding a die to a first side of the interconnecting structure, and etching the first substrate from a second side of the interconnecting substrate, the etching exposing a portion of the conductive pad.

Another embodiment is a method of forming a semiconductor device, the method comprising forming a conductive pad in a top surface of a first substrate, forming a passivation layer over the top surface of the first substrate and the conductive pad, forming pad connectors in the passivation layer contacting the conductive pad, forming an interconnecting structure over the passivation layer and pad connectors, forming a first structure over the interconnecting structure, and removing the first substrate to expose the conductive pad.

A further embodiment is a method of forming a semiconductor device, the method comprising forming a conductive pad in a top surface of a first substrate, forming a passivation layer over the top surface of the first substrate and the conductive pad, forming pad connectors in the passivation layer contacting the conductive pad, forming a plurality of thin film layers and a plurality of metal layers disposed therein over the passivation layer and the pad connectors, at least one of the plurality of metal layers contacting the pad connectors, bonding a die to at least one of the plurality of metal layers, and thinning a bottom surface of the first substrate to expose the conductive pad.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and operations described in the specification. As one of ordinary skill in the art will readily appreciate from the disclosure, processes, machines, manufacture, compositions of matter, means, methods, or operations, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or operations.

What is claimed is:

1. A method comprising:
    embedding a conductive pad in a top surface of a first substrate, the conductive pad having a bottom surface and sidewalls, the bottom surface being parallel to the top surface of the first substrate, an uppermost surface of the conductive pad being level with the top surface of the first substrate;
    depositing a passivation layer over the conductive pad;
    forming pad connectors over and contacting the conductive pad, the conductive pad physically contacting the pad connectors and the passivation layer;
    forming an interconnecting structure over the pad connectors, the forming the interconnecting structure comprising;
    depositing a first dielectric layer over the pad connectors, forming first openings in the first dielectric layer;
    filling the first openings with a first conductive material to form first metal lines, a topmost surface of the first metal lines being level with a topmost surface of the first dielectric layer;
    depositing a second dielectric layer over the first dielectric layer, the second dielectric layer having a top surface and a bottom surface;
    forming second openings in the second dielectric layer; and
    filling the second openings with the first conductive material to form vias and second metal lines, a bottommost surface of the vias being level with the bottom surface of the second dielectric layer, a topmost surface of the second metal lines being level with the top surface of the second dielectric layer;
    removing the first substrate for exposing the bottom surface and the sidewalls of the conductive pad;
    forming a pre-solder contact on the bottom surface of the conductive pad; and
    after forming the pre-solder contact, forming a first structure over the interconnecting structure.

2. The method of claim 1, wherein the embedding the conductive pad further comprises:
    etching a recess in the top surface of the first substrate; and
    filling the recess with a second conductive material.

3. The method of claim 1 further comprising attaching a second structure to the conductive pad.

4. The method of claim 3, wherein the attaching comprises:
    placing the second structure in contact with the pre-solder contact; and
    performing a reflow process while the conductive pad and the pre-solder contact are in contact with each other.

5. The method of claim 1, wherein the removing the first substrate comprises:
    grinding the first substrate; and
    etching a remaining portion of the first substrate to expose the conductive pad.

6. The method of claim 1, wherein the forming the first structure over the interconnecting structure further comprises:
    bonding a die to the interconnecting structure; and
    molding the die with a molding compound.

7. The method of claim 1, wherein the forming the first structure over the interconnecting structure further comprises:
    forming a conductive connector over and coupled to the interconnecting structure; and
    mounting a carrier substrate to the conductive connector.

8. The method of claim 1 further comprising:
    after the removing the first substrate, forming a conductive connector on the exposed conductive pad; and
    bonding a die to the conductive connector.

9. The method of claim 1 further comprising forming a passivation layer over the top surface of the first substrate and the conductive pad, the pad connectors being formed in the passivation layer.

10. A method comprising:
forming a first conductive pad in a first recess of a first substrate;
forming a second conductive pad in a second recess of the first substrate, the first conductive pad and the second conductive pad being level with a surface of the first substrate;
forming a first passivation layer over the first conductive pad and the second conductive pad;
embedding a first set of pad connectors and a second set of pad connectors in the first passivation layer, the first set of pad connectors physically contacting the first conductive pad, the second set of pad connectors physically contacting the second conductive pad;
forming a first dielectric layer over the first passivation layer;
embedding a first metal trace, a second metal trace, and a third metal trace in the first dielectric layer, the first metal trace physically contacting one of the first set of pad connectors, the second metal trace physically contacting another of the first set of pad connectors, the third metal trace physically contacting all of the second set of pad connectors;
forming an interconnecting structure over the first dielectric layer, the forming comprising:
forming a second dielectric layer over the first dielectric layer;
patterning the second dielectric layer to form a plurality of openings, the plurality of openings exposing the first metal trace, the second metal trace, and the third metal trace; and
filling the plurality of openings with a conductive material to form a first via, a second via, a third via, a fourth via, a fourth metal trace, and a fifth metal trace, the first via being directly interposed between the first metal trace and the fourth metal trace, the second via being directly interposed between the second metal trace and the fourth metal trace, each of the third via and the fourth via being directly interposed between the third metal trace and the fifth metal trace, the fourth metal trace and the fifth metal trace having topmost surfaces level with a topmost surface of the second dielectric layer;
bonding a die to a first side of the interconnecting structure; and
after bonding the die, etching the first substrate from a second side of the interconnecting structure, the etching removing all of the first substrate and exposing a portion of the first conductive pad.

11. The method of claim 10 further comprising attaching a second structure to the conductive pad.

12. The method of claim 10, wherein the bonding the die to the first side of the interconnecting structure comprises:
forming a first connector over the first side of the interconnecting structure, the first connector coupled to a metal layer in the interconnecting structure;
forming a second connector on an active surface of the die; and
bonding the first connector to the second connector.

13. The method of claim 12, wherein the first connector comprises a solder ball, a metal pillar, a micro bump, or a controlled collapse chip connection bump.

14. The method of claim 10, wherein the etching the first substrate comprises:
mounting a carrier to a backside surface of the die;
grinding the first substrate; and
etching a remaining portion of the first substrate to expose the conductive pad.

15. A method comprising:
forming a recess in a first substrate, the first substrate having a first surface and a second surface, the first surface facing an opposite direction than the second surface, the recess extending from the first surface only partially into the first substrate, the recess having a bottom surface and sidewalls, the bottom surface and the sidewalls of the recess being a same material;
forming a conductive feature in the recess, the sidewalls and a bottom of the conductive feature contacting the same material of the first substrate, wherein the conductive feature comprises one or more first conductive layers;
planarizing the first surface of the conductive feature, wherein after planarizing the first surface of the first substrate and an upper surface of the conductive feature are level;
forming an interconnect structure over the conductive feature and the first substrate, wherein forming the interconnect structure comprises:
depositing a plurality of conductive layers, wherein each of the plurality of conductive layers comprises a plurality of traces;
depositing a plurality of dielectric layers, wherein adjacent ones of the plurality of conductive layers are separated by one or more of the plurality of dielectric layers;
etching openings in each of the plurality of dielectric layers, wherein each of the openings expose an underlying conductor, wherein a topmost surface of each of the plurality of conductive layers is level with a topmost surface of respective ones of the plurality of dielectric layers; and
depositing one or more second conductive layers in each of the openings to form conductive vias;
forming an underbump metallurgy (UBM) over the interconnect structure;
attaching a die to the UBM;
after attaching the die, performing a first removal process to remove a first portion of the first substrate, wherein the first removal process removes material of the first substrate from the second surface toward the first surface; and
performing a second removal process to remove all remaining portions of the first substrate after the first removal process, wherein the second removal process removes material of the first substrate from the second surface toward the first surface.

16. The method of claim 15, wherein the first removal process comprises a grinding process.

17. The method of claim 16, wherein the second removal process comprises an etching process.

18. The method of claim 15, wherein the same material comprises a silicon substrate.

19. The method of claim 15, wherein the interconnect structure comprises a first conductive pad, a second conductive pad, and a plurality of vias interposed between the first conductive pad and the second conductive pad.

20. The method of claim 15, wherein the interconnect structure comprises:
an upper conductive pad;
a lower conductive pad;
a first intermediate conductive pad;

a second intermediate conductive pad;
a first conductive via connecting the upper conductive pad to the first intermediate conductive pad;
a second conductive via connecting the upper conductive pad to the second intermediate conductive pad;
a third conductive via connecting the lower conductive pad to the first intermediate conductive pad; and
a fourth conductive via connecting the lower conductive pad to the second intermediate conductive pad.

* * * * *